United States Patent [19]

Chambers, IV

[11] Patent Number: 5,426,779
[45] Date of Patent: Jun. 20, 1995

[54] METHOD AND APPARATUS FOR LOCATING LONGEST PRIOR TARGET STRING MATCHING CURRENT STRING IN BUFFER

[75] Inventor: Lloyd L. Chambers, IV, Menlo Park, Calif.

[73] Assignee: Salient Software, Inc., Palo Alto, Calif.

[21] Appl. No.: 839,958

[22] Filed: Feb. 21, 1992

Related U.S. Application Data

[63] Continuation-in-part of Ser. No. 759,226, Sep. 13, 1991, Pat. No. 5,155,484.

[51] Int. Cl.⁶ .............................................. G06F 15/40
[52] U.S. Cl. ..................... 395/600; 364/956; 364/963; 364/963.1; 364/963.2; 364/963.3; 364/974; 364/974.6; 364/DIG. 2; 341/55; 341/106
[58] Field of Search ............... 364/DIG. 1, DIG. 2; 341/50, 51, 55, 67, 106; 395/400, 600

[56] References Cited

U.S. PATENT DOCUMENTS

| | | | |
|---|---|---|---|
| 4,386,416 | 5/1983 | Giltner et al. | 364/900 |
| 4,558,302 | 12/1985 | Welch | 340/347 DD |
| 4,730,249 | 3/1988 | O'Quinn, II et al. | 364/200 |
| 4,831,583 | 5/1989 | Pascoe | 364/900 |
| 4,903,018 | 2/1990 | Wiebach et al. | 341/51 |
| 4,988,998 | 1/1991 | O'Brien | 341/55 |
| 5,016,009 | 5/1991 | Whiting et al. | 341/67 |
| 5,049,881 | 9/1991 | Gibson et al. | 341/95 |
| 5,051,745 | 9/1991 | Katz | 341/51 |
| 5,051,947 | 9/1991 | Messenger et al. | 364/900 |
| 5,146,221 | 9/1992 | Whiting et al. | 341/67 |
| 5,146,560 | 9/1992 | Goldberg et al. | 395/200 |
| 5,150,430 | 9/1992 | Chu | 382/56 |
| 5,153,591 | 10/1992 | Clark | 341/51 |
| 5,155,484 | 12/1992 | Chambers, IV | 341/55 |
| 5,179,378 | 1/1993 | Ranganathan et al. | 341/51 |
| 5,214,779 | 5/1993 | Barker et al. | 395/600 |

*Primary Examiner*—Thomas G. Black
*Assistant Examiner*—Marie N. Von Zuhr
*Attorney, Agent, or Firm*—Fliesler, Dubb, Meyer & Lovejoy

[57] ABSTRACT

An apparatus and method are disclosed for finding a target string in a history buffer, where the found target string matches a given current string to a maximum practical length. A presorted array of array entries (SP) is defined where each entry uniquely identifies a value and a location of a respective string-start byte pair in the history buffer. The array entries are sorted primarily upon their string-start byte-pair values and secondarily upon their pointed-to locations. A direct lookup table (DLT) is further provided, indexable by each possible string-start byte pair that may appear in the history buffer. The DLT is used to locate a first array entry for a given string-start byte pair. To find a longest matching target string, the first two bytes of the current string are used as an index into the direct lookup table, and the given table entry is then used as an index into the presorted SP array. The corresponding array entry is used as an index to a first target string in the buffer. Each subsequent array entry having the same string-start byte pair value is used to locate a next target string. A longest matching string is determined from among the target strings pointed to by the SP array. The location and length of the longest matching string are returned as a result.

32 Claims, 17 Drawing Sheets

METHOD AND APPARATUS FOR LOCATING LONGEST PRIOR TARGET STRING MATCHING CURRENT STRING IN BUFFER

CROSS-REFERENCE TO RELATED APPLICATION

This application is a continuation-in-part of application Ser. No. 07/759,226 entitled "Fast Data Compressor with Direct Lookup Table Indexing into History Buffer", which was filed Sep. 13, 1991 by Lloyd Lamont Chambers IV, now U.S. Pat. No. 5,155,484, issued Oct. 13, 1992, which is commonly assigned with the present application, and which is incorporated herein by reference as if fully set forth herein.

BACKGROUND OF THE INVENTION

1. Field of the Invention

The present invention relates generally to string matching techniques, and more specifically to an improved method and apparatus for finding, in a buffer, a target data string which matches a current data string to a length greater than or equal to all other target data strings which are located in the buffer prior to the current string. This improved method and apparatus may advantageously be used in a data compressor, for example.

2. Description of the Background

Data compression is useful in a variety of circumstances. Compressed data occupy less storage on a permanent storage medium. Compressed data take less time to transfer over a communication link. Compressed data in network packets have an is improved effective data content, increasing the effective packet content and the network throughput. Pages containing compressed data in a virtual memory system can be swapped in and out more quickly.

Data compressors take advantage of repeated strings in a series of data. Second and subsequent instances of a given string are represented by a relatively short reference to a previous instance of the string. Prior techniques, such as Lempel-Ziv compressors, maintain "dictionaries" of previously-encountered strings of bytes. In order to determine whether a given string has previously been encountered, prior techniques generally employ some sort of hashing function to access the dictionary. Hashing consumes computational resources, and slows down the compression of data.

The new method and apparatus of data compression and decompression described in the cross-referenced application "Fast Data Compressor with Direct Lookup Table Indexing into History Buffer" eliminates the need for a dictionary and also eliminates the need for hashing. A direct lookup table (DLT[]) is indexed or addressed by the first two bytes of a current data string in a history buffer (HB[]). A given entry in the DLT[] contains an offset or address in the HB[], at which a most recent prior string was found which began with the same two bytes with which the current string begins. When a previous matching string exists, the data compressor determines the length of the matching string, and outputs a vector reference back to the previous string. The DLT[] is then updated to reflect the newly-found current-string. A subsequent-string will later be referenced back to this new string, rather than to the previous string.

This method is extremely fast, offering a substantial improvement over its predecessors. More significantly, perhaps, is the fact that the disclosed decompressor can decompress the resulting compressed data at dramatically improved speeds, as is detailed in the cross-referenced application. However, the compressor of the cross-referenced application does not always obtain a theoretically maximum compression ratio.

For example, consider the string "ABCDABCABCD". According to the compressor of the cross-referenced application, the first "ABCD" bytes will be output as literal data, and the DLT[] entry addressed by "AB" (i.e. DLT["AB"]) will point to the first instance of "AB". Then, when the second instance of "ABC" is encountered, a vector will be outputted referring back to the first instance, with an indicated duplicate length of three (second "ABC" matches first "ABC"). The DLT["AB"] entry will be updated to point to the second, most recent instance of "AB". Subsequently, the third-instance of "ABC" will be found, and will be matched back against the second instance of "ABC", where the entry DLT["AB"] is then pointing. A vector will be outputted referring back to the second "ABC", indicating a length of three (third "ABC" matches second "ABC"). Finally, the last "D" will be output as a literal.

It is desirable that this last, literal "D" be avoided. What is needed, therefore, is an improved string matching apparatus and method which finds optimal previous target strings having maximum matching string lengths with a current string. For example, it is desirable that such an improved data compressor reference the second "ABCD" back to the first "ABCD", rather than merely referencing the third "ABC" back to the second "ABC" and then outputting an excess "D" literal.

SUMMARY OF THE INVENTION

Therefore, the present invention is an improved apparatus and method for locating a longest prior target string matching a current string in a data buffer.

The string matching apparatus and method maintains a sorted pairs array (SP[]) which references all instances of byte pairs, not only a most recently found pair. The apparatus and method maintain a direct lookup table (DLT[]) which, rather than indexing the HB[], addresses the SP[].

The first two bytes of the current string (i.e. the current data pair) are used to address the DLT[]. The DLT[current pair] entry points to the first SP[] entry that identifies an HB[] location at which the same two bytes are found. In other words, the addressed DLT[] entry points to the first prior matching string of length at least two.

;The apparatus, and method determine matching string lengths for each SP[] entry pointing to target strings which match the current string, and determine which of those target strings matches the current string to the greatest length.

By this method and apparatus, it is guaranteed that a vector output to represent the current string will have near-optimal efficiency, or in other words, will avoid the most literal outputs.

In one embodiment, the apparatus and method are part of a data compression system. The data compression system compresses data from the HB[] to an output buffer, maintaining the DLT[] indexable by data pairs from the HB[]. The DLT[] entries point into the SP[], which indexes all data pairs in the HB[]. The SP[] permits rapid access to all prior strings which match the current string to a length of at least two bytes. Once the optimally matching target string is found, any encoding scheme whatsoever may be employed. Thus, the present invention is a "front end" for a data compressor. In one mode, the encoding scheme disclosed in the cross-referenced application is employed as the "back end" of the data compressor.

In an alternative embodiment, no DLT[] is required. The DLT[] is relatively large, taking 128 kilobytes for example. If this amount of memory is not available, the SP[] may be indexed by any conventional means, such as by binary searching for a first entry which points to a matching target string. This may be slower than directly accessing this first entry via the DLT[], but will nevertheless take less memory.

In various modes which depend upon the selected "back end" encoding portion of the data compressor, certain optional enhancements may be employed upon the SP[]. For example, SP[] entries which point so far back in the HB[] as to be non-referenceable from the current string (i.e. the chosen vector size cannot include a sufficiently large offset), those SP[] entries may be removed or destroyed from the SP[]. Alternatively, the appropriate DLT[] entry may simply be updated to access a next matching string after the non-accessible strings.

BRIEF DESCRIPTION OF THE DRAWINGS

FIG. 6 is a flowchart depicting operation of one mode of encoding a literal byte, as described in the cross-referenced application.

FIGS. 10 and 11 respectively show the improved data compressor of the present invention embodied as software in a floppy disk or the like and as firmware in a logic device such as a ROM or the like.

DETAILED DESCRIPTION OF THE PREFERRED EMBODIMENTS

A fundamental portion of the core of the present invention—the string matching methodology—is described below in section IX with reference to FIG. 19. However, sections I to VIII provide information which the reader may find helpful in understanding the context of the invention, and illustrate one means and method of carrying out the invention as a whole. These other portions of the invention are discussed below prior to a discussion of the string matching, to provide the reader a more chronologically accurate depiction of operation of the invention as a whole.

I. EXEMPLARY ENVIRONMENTS

Figure 1:
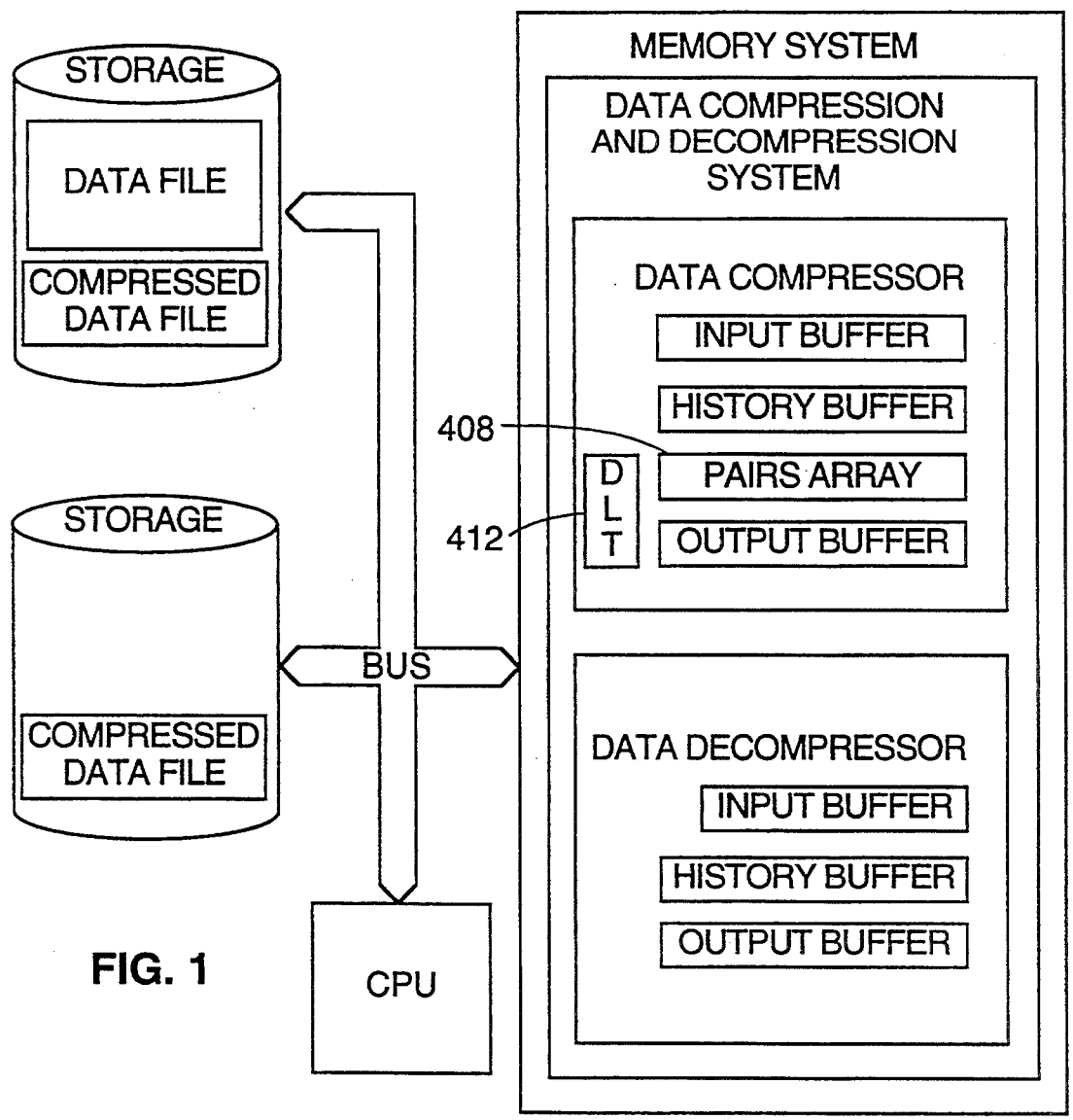
FIGS. 1-3 illustrate data compression performed in an archival system, a communication system, and a network system.
Figure 2:
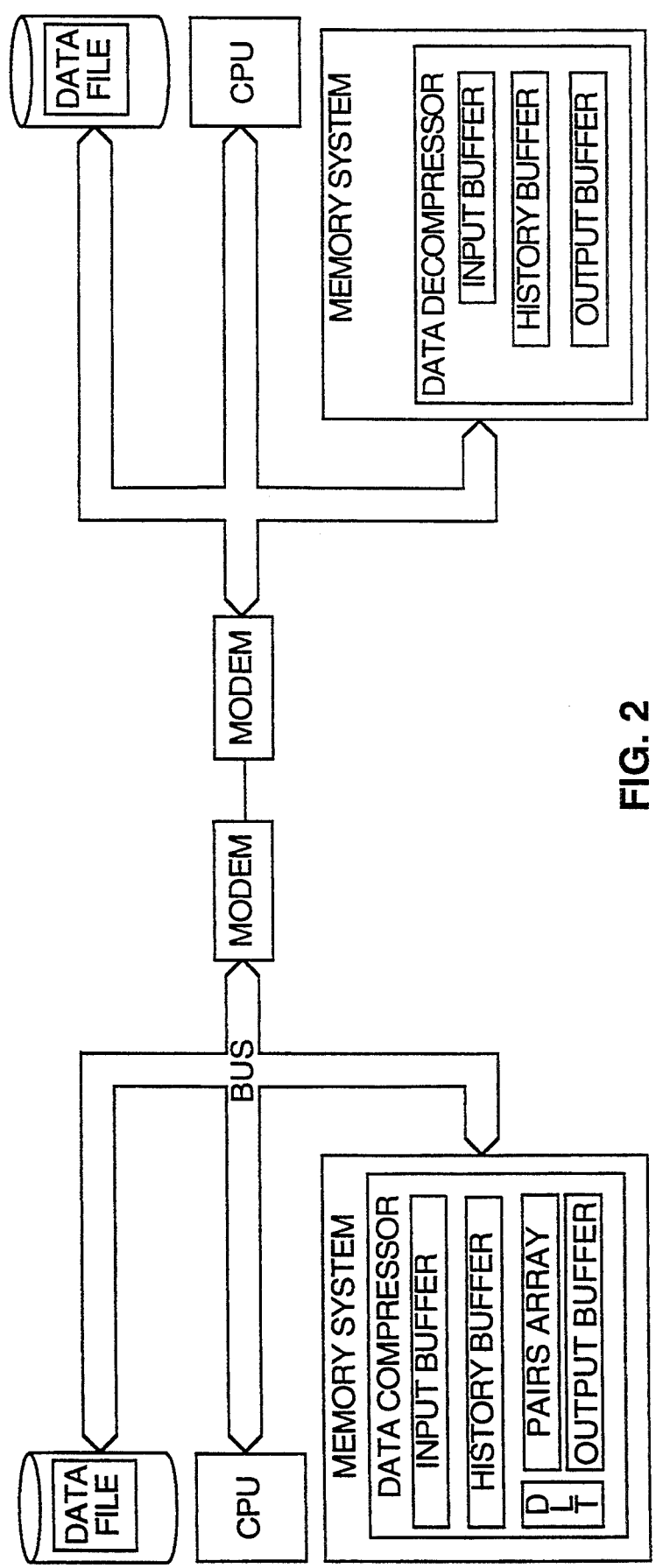
Figure 3:
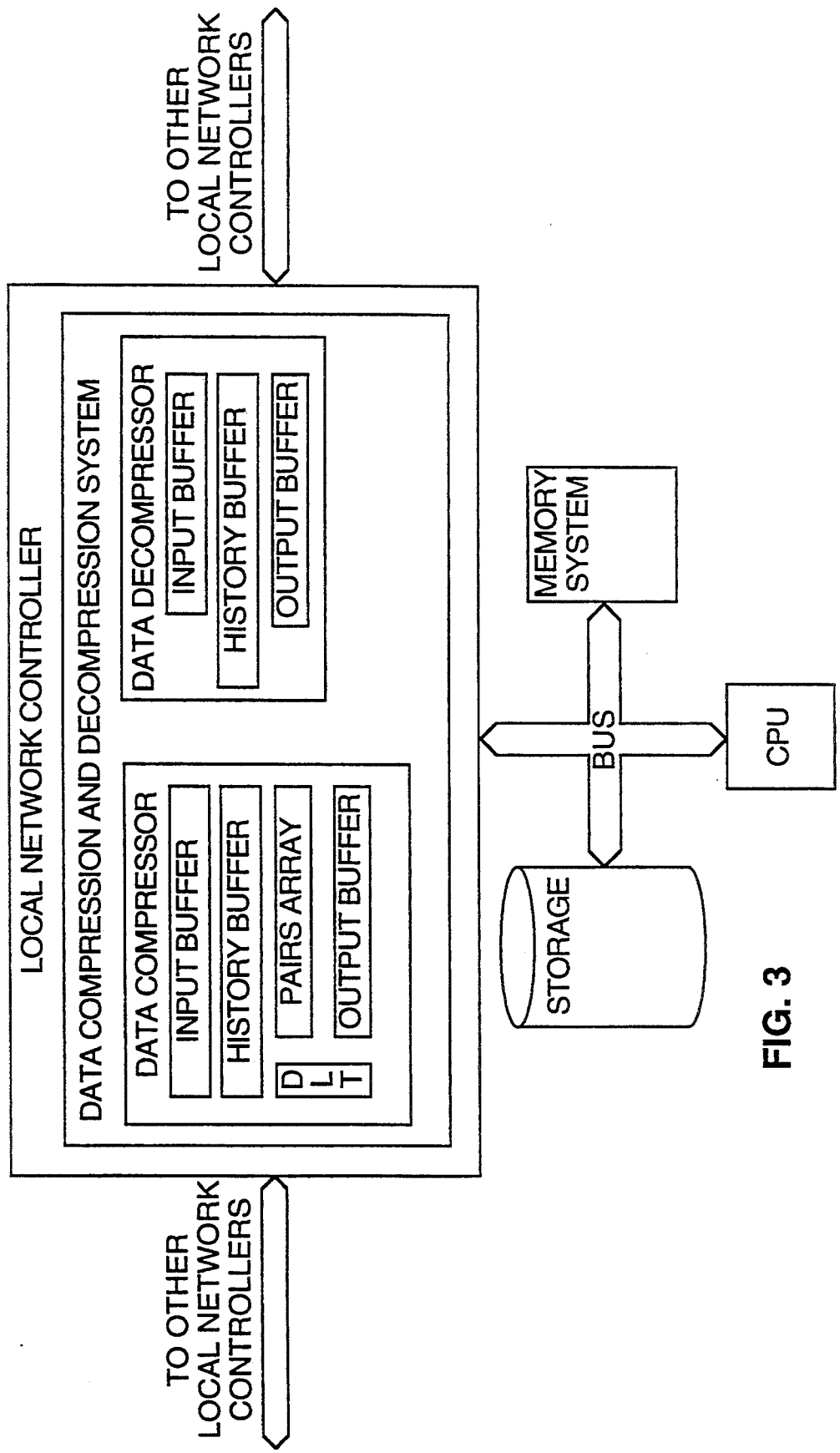

FIG. 1 shows the present invention as utilized in a data compression system in a microcomputer, for example. FIG. 2 shows the present invention as utilized in data compression in a computer-to-computer modem transfer system, for another example. FIG. 3 shows the present invention as utilized in data compression in a network packetizing apparatus, for yet another example. In each of those embodiments, the data compressor includes a buffer means, an SP[] array means, a DLT[] means, and an output means. The invention may be practiced using any appropriate digital logic system, such as a computer, a "smart" modem, a network controller or node, a hard disk drive, a microprocessor, or the like.

II. DATA STRUCTURES EMPLOYED BY THE INVENTION

Figure 4:
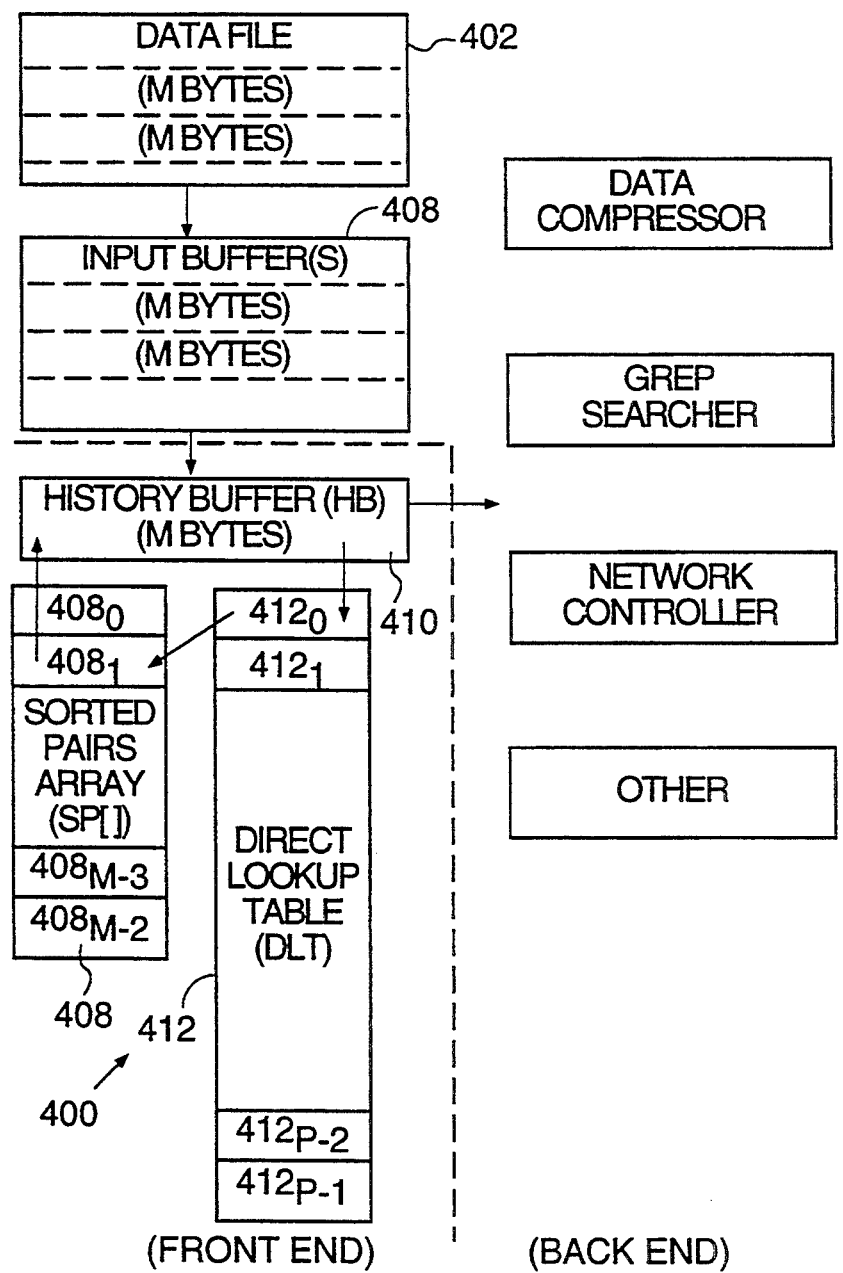
FIG. 4 illustrates uncompressed, compressed, and decompressed data files, and the input and output buffers, history buffers, direct lookup table, and sorted pairs array employed by the present invention.

FIG. 4 illustrates the present invention as utilized in a data compression/decompression system 400, such as is generally shown in FIGS. 1-3. A data file 402 is read into the system, optionally via one or more input buffers 404, as is well-known. Data from the file are loaded into a history buffer HB[] 408 in blocks of a fixed, given size M. In one mode, the HB[] includes eight kilobytes of data.

A sorted pairs array (SP[]) 408 includes M-1 entries $408_0$ to $408_{M-2}$. Each entry corresponds to an instance of a data pair which exists in the HB[]. Duplicate instances of a given data pair which are found in the HB[] will have corresponding individual entries in the SP[].

Each SP[] entry includes two items (not shown in FIG. 4): a copy of an individual instance of a data pair, and a location of that instance in the HB[]. In one mode, the location is stored as an offset, in bytes, from the beginning of the HB[]. In the mode where the HB[] can include eight kilobytes of data (eight kilobytes=$2^{13}$ bytes), a two-byte offset is used (to hold thirteen offset bits - with three unused bits). Thus, in the one mode, each SP[] entry comprises four bytes.

The DLT[] 412 includes $256^N$ entries $412_0$ to $412_{P-1}$, where N is a number of consecutive data bytes from the HB[] which are used to index into the DLT[]. In one mode, N=2, and the DLT[] includes $256^2$=sixty-four kiloentries. Thus, for each possible data pair value in the HB[], there is one uniquely corresponding DLT[] entry. Hence, the DLT[] will typically be much larger than either the HB[] or the SP[].

Each DLT[] entry includes one item: a location of an SP[] entry. In one mode, the location is stored as an offset, in bytes, from the beginning of the SP[]. Thus, with a maximum SP[] size of ($2^{13}-1$) entries * 4 bytes=32,764 bytes, fifteen bits are required to address the SP[], and each DLT[] entry comprises two bytes. Thus, in the described embodiment, the DLT[] comprises $256^{2\ entries}$ * 2 bytes=128 kilobytes.

III. EXEMPLARY CONTENTS OF THE DATA STRUCTURES

Figure 7:
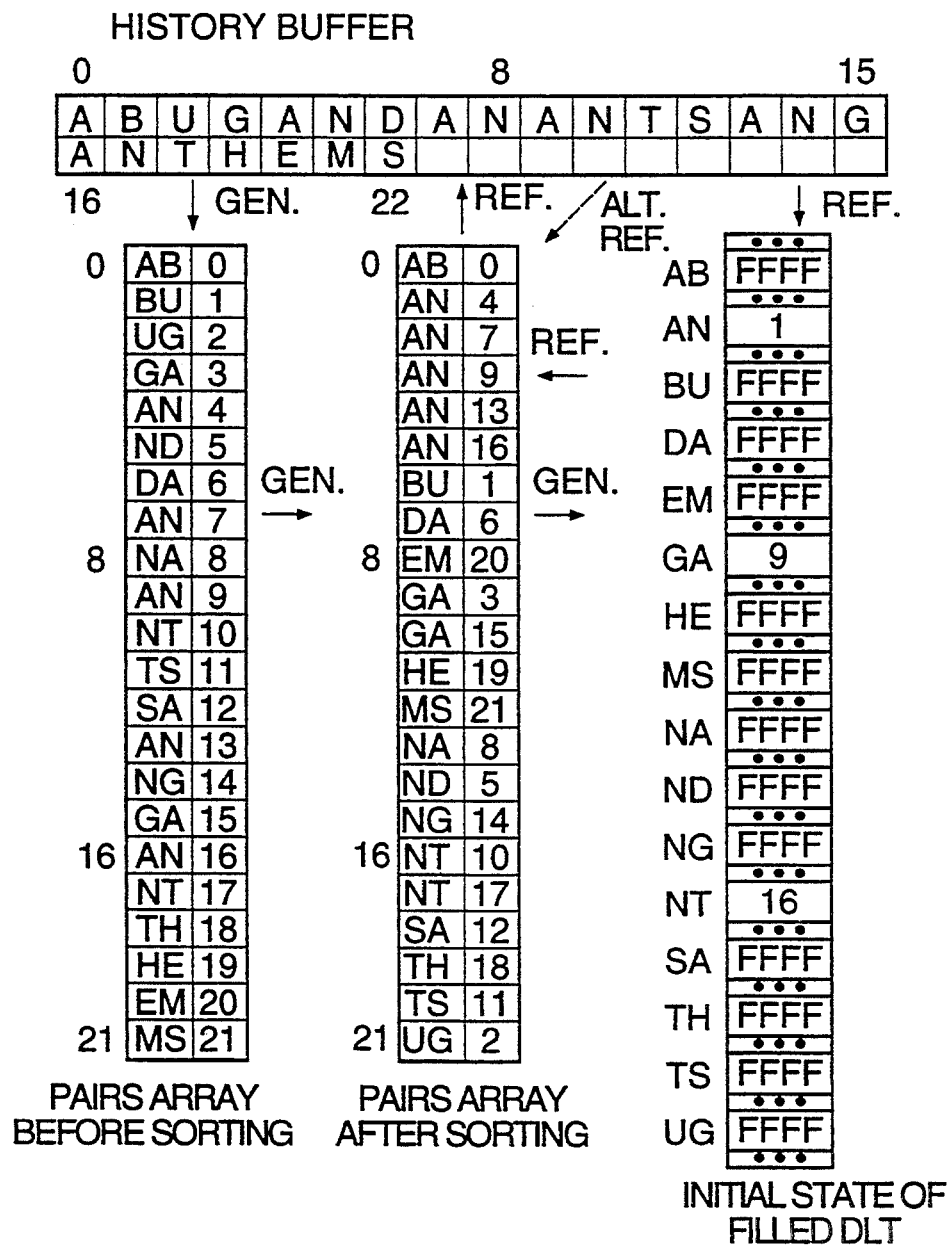
FIG. 7 illustrates one exemplary content of the history buffer, with the resulting content of the pairs array before and after sorting, and the resulting content of the direct lookup table.

FIG. 7 illustrates one example of data which may (partially) fill the HB[]: the data "ABUGAN-DANANTSANGANTHEMS". The twenty-three data bytes reside in the HB[] from location HB[0] to location HB[22], inclusive.

Each pair of bytes at location HB[J] and HB[J+1] comprise a data pair. To fill the SP[], beginning at location J=0, the pairs are loaded into the pairs array SP[]. Thus, location SP[0] is filled with an entry identifying the pair "AB" from location HB[0], and the location "0" of that pair in the HB[]. Then, SP[1] is filled with "BU" and "1", and so forth. Note that, while there are I=23 data bytes, there are only I−1=22 data pairs, because the final data byte does not have a subsequent item with which to form a pair.

Once the SP[] is filled, it is sorted. The sort is primarily upon the data byte content of the entries, and secondarily upon the address content of the entries. Thus, the entry for "AB" is found in the SP[] prior to the entry for "UG"; and, within the entries for "AN", the entries are found in numerical order of their SP[] address, "4" before "7" etc.

Once the SP[] is sorted, its contents are used to fill the DLT[]. First, the entire DLT[] is "zeroed out" to some predetermined value. In one mode, this value is −1, represented by its two's-complement hexadecimal equivalent, "FFFF". This number is used to signify empty DLT[] entries, because no entry in the SP[] will be found before the first entry, SP[0].

After the DLT[] is initialized, selected ones of its entries are set. Each set DLT[] entry identifies a data pair actually found in the HB[]. In one mode, each set DLT[] entry more specifically identifies a data pair which is found least twice in the HB[]. Thus, set DLT[] entries identify duplicated strings, which are the potential areas where compression may occur. The choice as to which DLT[] entries should be filled may be made simply by consulting the sorted SP[], and looking for sequential SP[] entries having identical data pair items. In one mode, the DLT[] entry is set to point to the first occurrence of such a repeated SP[] entry. In FIG. 7, for example, DLT["AN"] is set to point to SP[1], which in turn points to HB[4], where the first occurrence of "AN" is found.

IV. EXEMPLARY MATCHING METHODOLOGY

FIG. 7 further illustrates a general methodology for using the DLT[] and the SP[] to find an optimally matching target string. In one sense, "optimally" is defined as meaning simply a previous string which matches a current string to a length greater than or equal to all other previous strings. Further refinements of the definition will be understood with reference to enhanced optimizations of the invention, to be described below.

Consider, for example, that the current string begins at HB[16], starting with the pair "AN". There are four previous matching target strings, all beginning with the pair "AN". As seen in the sorted SP[], these are found beginning at HB[4], HB[7], HB[9], and HB[13].

According to the method of the cross-referenced application, the DLT[] (which in that case directly addresses the HB[]) would point to HB[13] when the current string is at HB[16]. The third characters of the strings beginning at HB[13] and HB[16] do not match, being "G" and "T", respectively. Thus, the former method would yield a matching string length of two.

By way of contrast, the present invention correctly determines that a matching string of length three is found at HB[9], as there is a string "ANT" at both HB[9] and HB[16].

When the string matching function begins at the new current string at HB[16], the present invention consults DLT["AN"] to find the first instance of a string beginning with "AN". Alternatively, the invention can operate without a DLT[], making reference from the HB[] into the SP[], via any conventional searching technique, rather than via a DLT[].

The invention consults HB[4] (i.e. HB[SP[DLT["AN"]]]) and determines that the matching string length there is two. The invention then checks the next SP[] entry, SP[2], to determine whether there is another "AN" string in the HB[]. SP[2] indicates that there is, so the invention consults the HB[] at the location HB[7] as indicated by SP[2], and finds another string matching to length two. The invention then finds a length three string at HB[9] through SP[3], and another length two string at HB[13] through SP[4]. By recording the location of the largest-yet string along the way, the invention finds the longest matching string, at HB[9].

The result of this portion of the invention is simply an identification of the optimal target string. In the example, the result would be that "a length three string is found at HB[9]". This result can be used for whatever purposes it is needed. Typically, it will be used in a data compressor to maximize the compression ratio. However, other embodiments are contemplated, such as use in "grep" searching and the like.

V. DATA COMPRESSION EMBODIMENT

Figure 5:
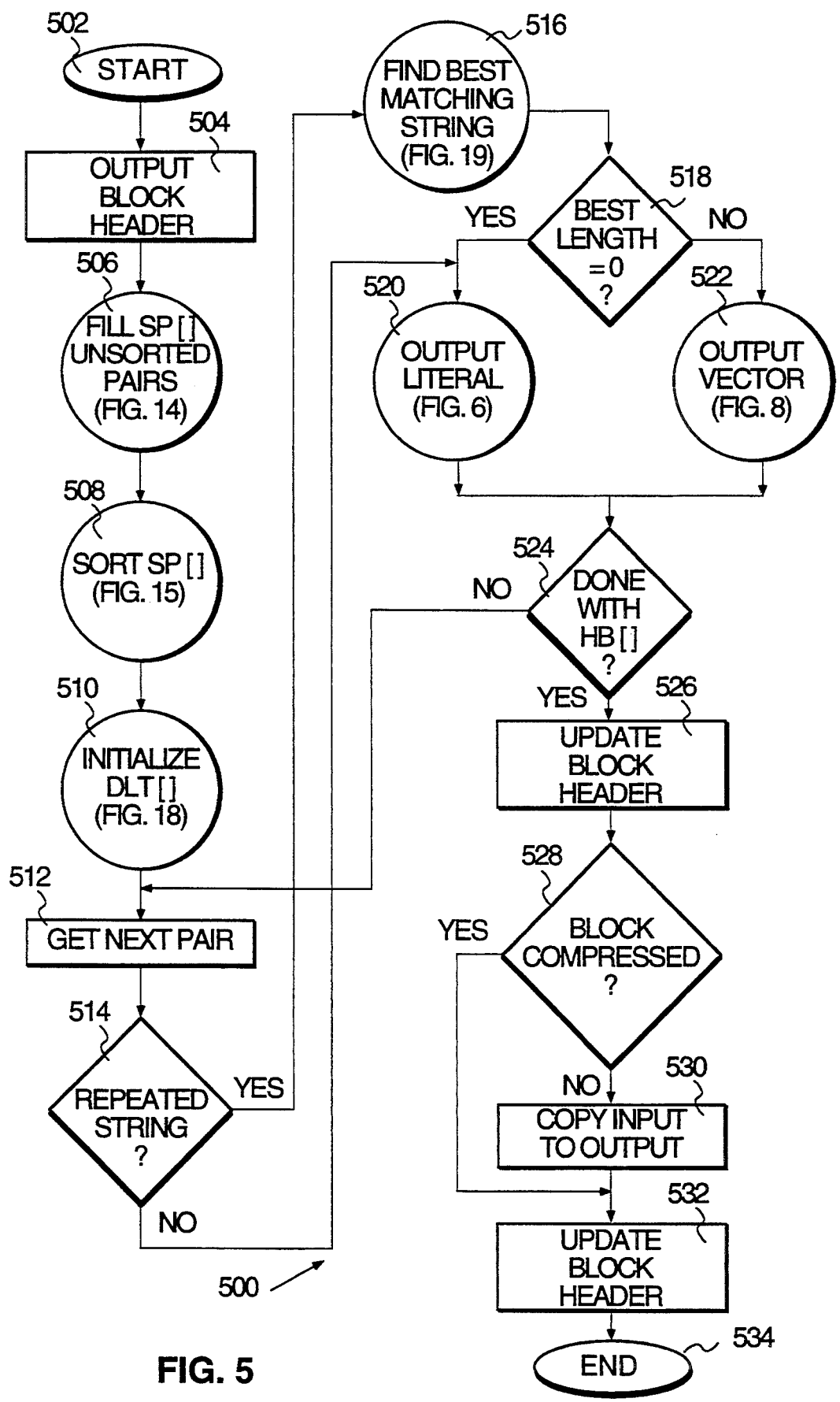
FIG. 5 is a flowchart depicting high-level operation of the present invention.
Figure 12:
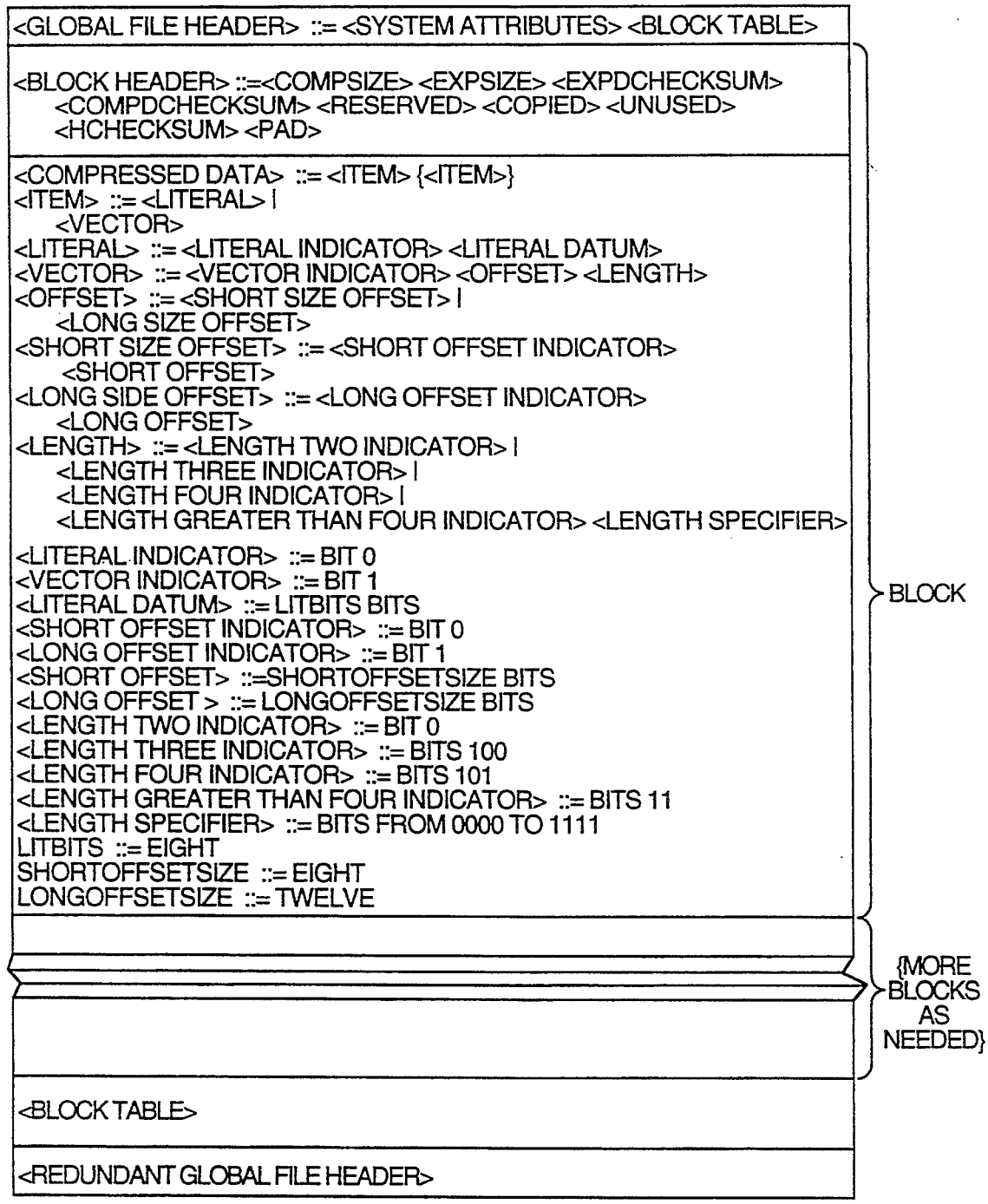
FIG. 12 illustrates one mode of a compressed data file, as described in the cross-referenced application.
Figure 13:
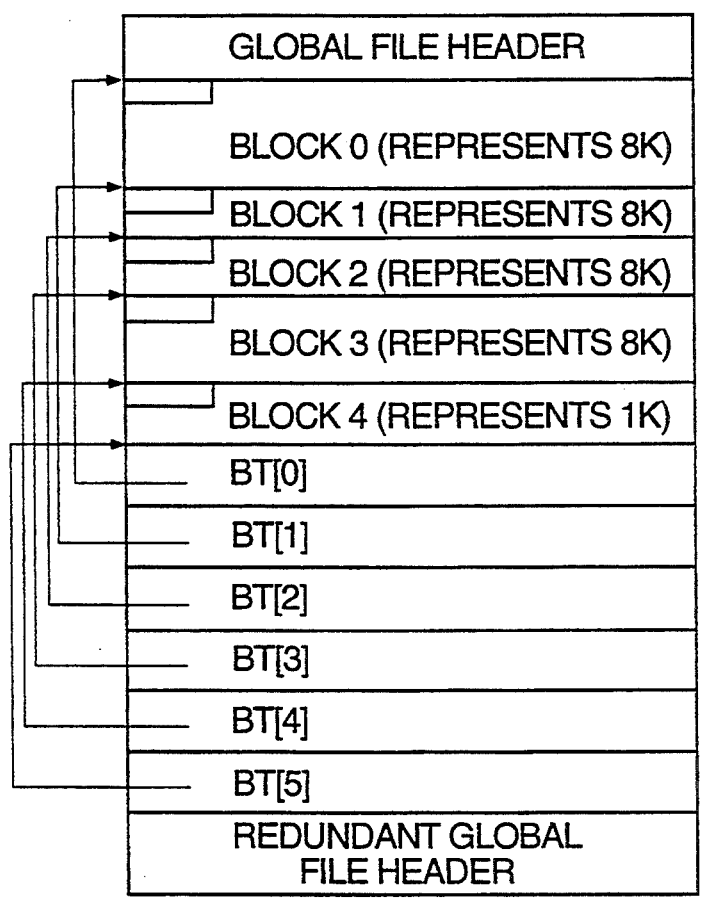
FIG. 13 illustrates a compressed data file, specifically pointing out the block table entries, as described in the cross-referenced application.

FIG. 5 illustrates in general terms the operation 500 of a data compressor constructed using the data accessing and string matching techniques of the present invention. Operation of the data compressor begins at node 502, and proceeds with the outputting of a block header at block 504. Such a block header is described in the cross-referenced application, and in FIG. 12.

Figure 18:
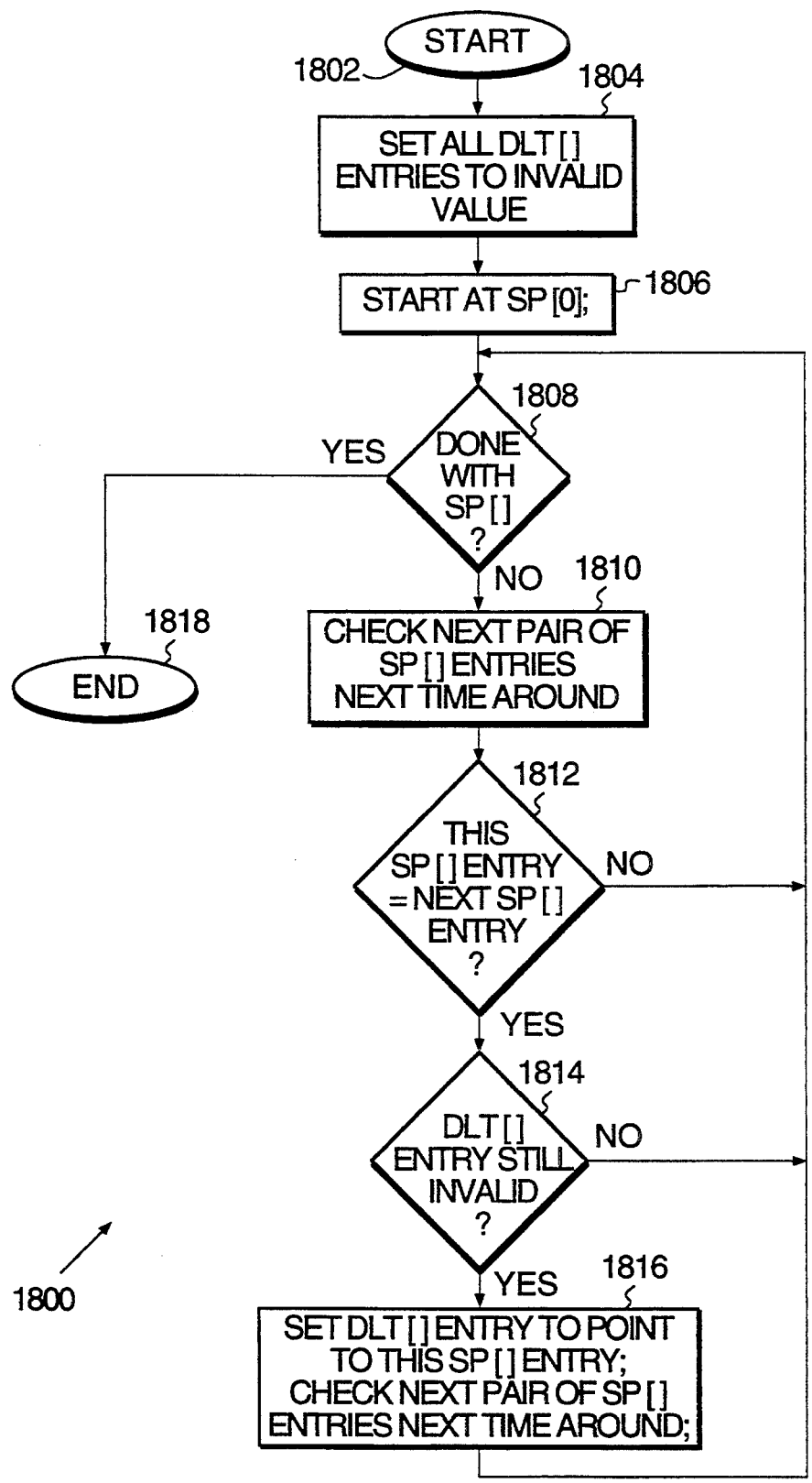
FIG. 18 is a flowchart depicting operation of the present invention to fill the direct lookup table from the sorted pairs array.

In FIG. 5, operation then continues at node 506, at which the invention fills the SP[] with unsorted data pairs as described above. This method is shown in more detail in FIG. 14, to be described below. In FIG. 5, operation continues at node 508 with the sorting of the SP[], performed by the operations shown in FIG. 15, to be described below. Then, the DLT[] is initialized at node 510 as shown in FIG. 18, to be described below. This completes the "setup" portion of the invention.

The data compression begins at block 512, which fetches a next pair from the HB[].

At conditional block 514, the data compressor checks whether the current data pair is one of a duplicated pair in the HB[]. This is done by consulting the DLT[]. As explained above, if there were two or more instances of the pair, the give DLT[] entry will not be "FFFF". In this case, operation passes to the string matching routine shown generally at node 516 and in more detail in FIG. 19, to be described below. This completes the core string matching portion of the invention.

If the string matching routine determines that the matching string length is zero, as determined by conditional block 518, operation passes to node 520. This condition may occur, for example, if a matching string was found, but it was too far back for the back end compressor to reference by predetermined offset size. Also, if conditional block 514 determined that the pair was not repeated in the HB[], operation will pass immediately to node 520.

Figures 6, 11:
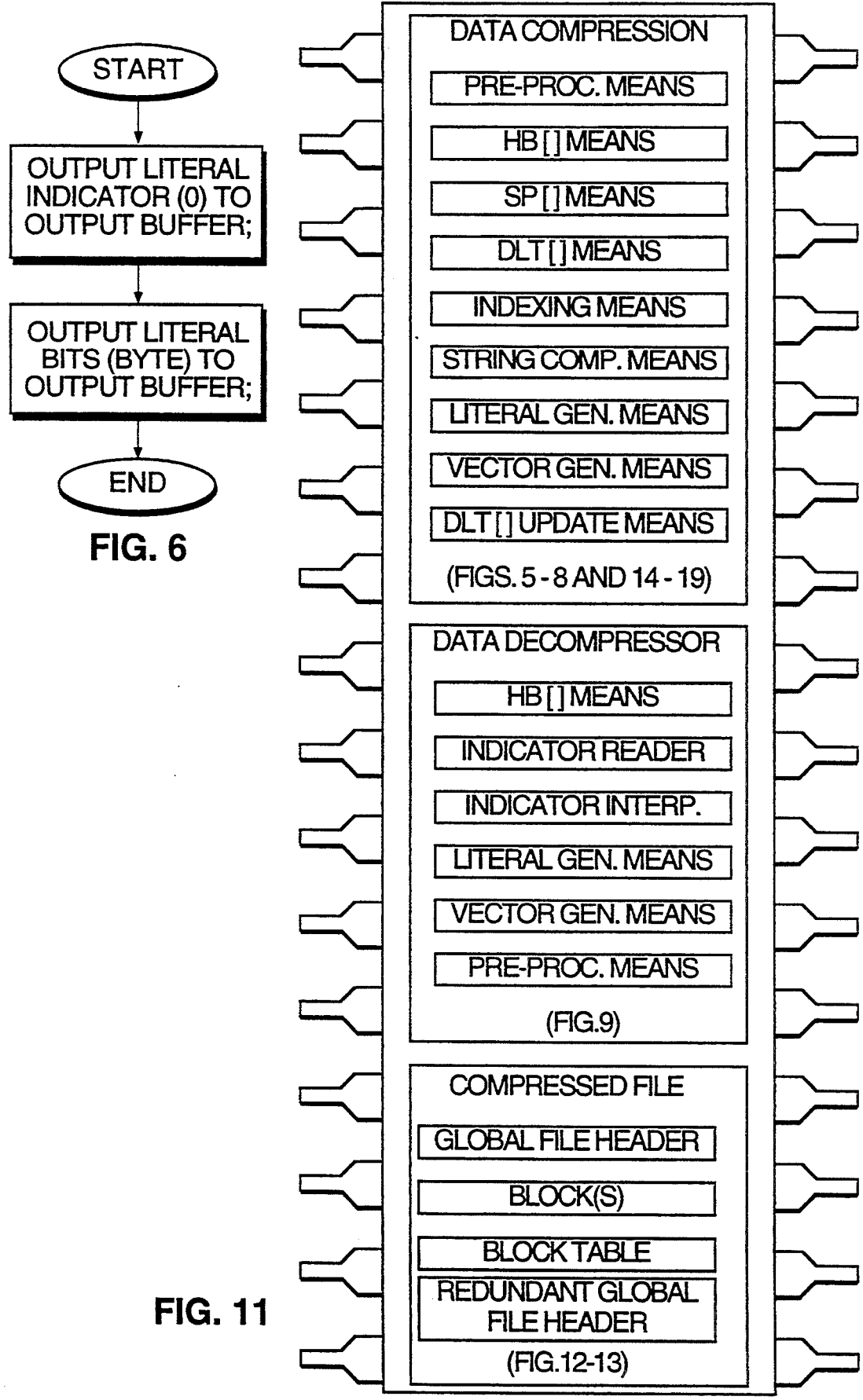

Node 520 outputs a literal to the compressed data file, by any preferred encoding. FIG. 6 depicts the encoding method taught by the cross-referenced application.

Figure 8:
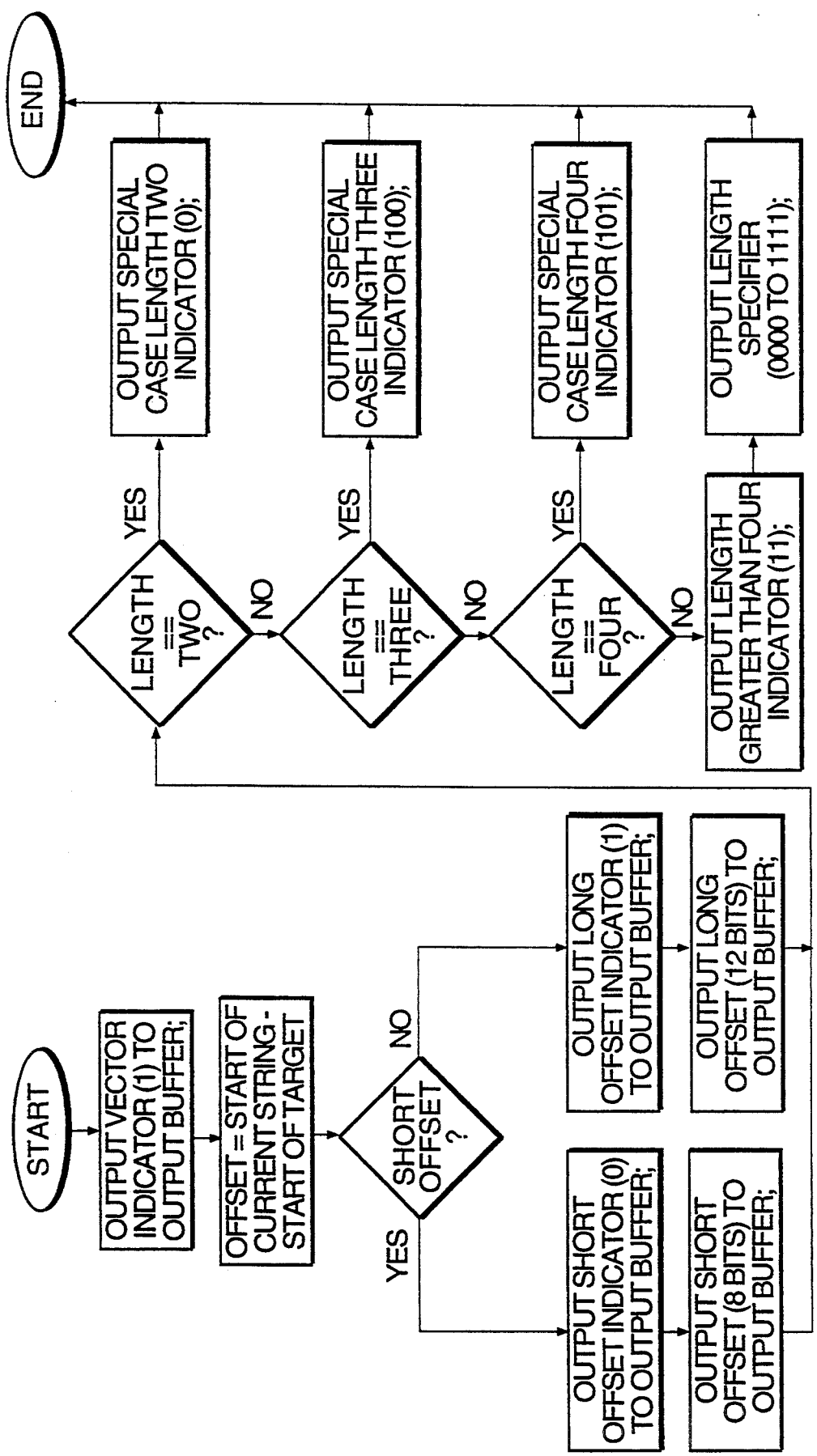
FIG. 8 is a flowchart depicting operation of one mode of encoding a vector, as described in the cross-referenced application.
Figure 9:
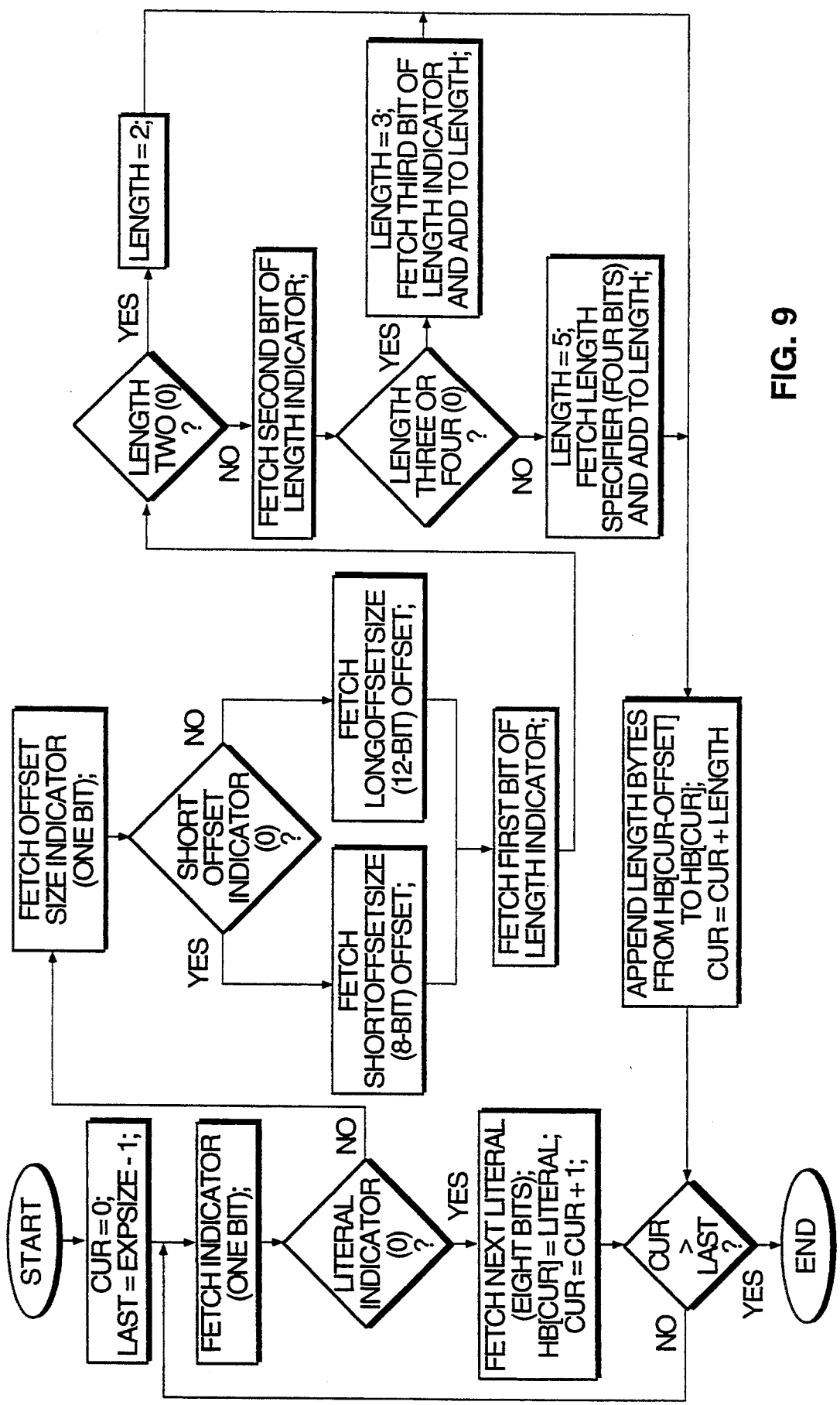
FIG. 9 is flowchart depicting operation of one mode of a decompressor, as described in the cross-referenced application.
Figure 10:
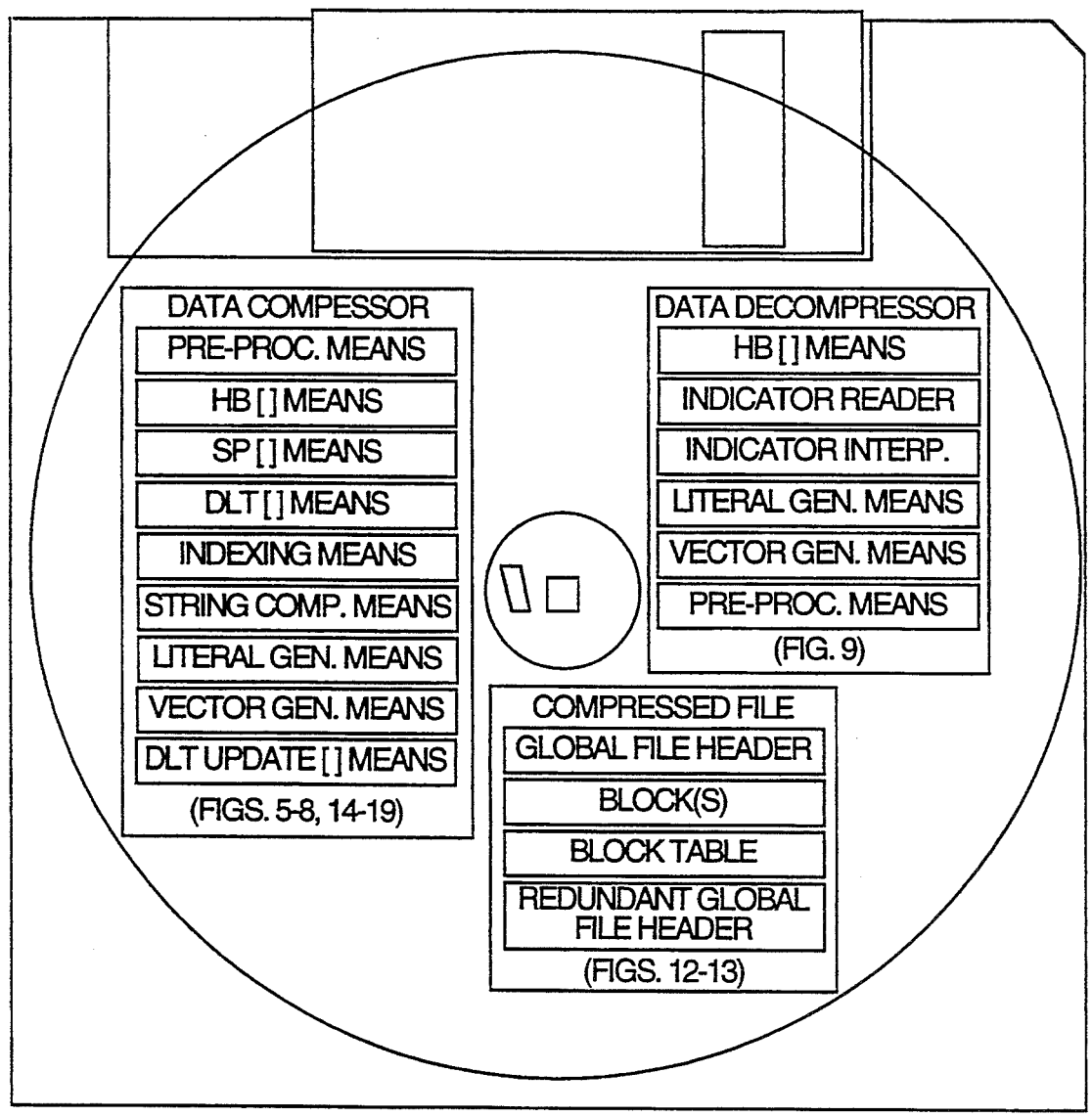

If, at conditional block 518, the matching string length is not zero, operation passes to node 522, which outputs a vector according to any preferred encoding. FIG. 8 depicts the encoding method taught by the cross-referenced application.

After the literal or vector is outputted, operation continues at conditional block 524, which checks whether compression of the HB[] is complete. If not, operation returns to block 512, which fetches the next pair of data bytes in the HB[]. If the entire HB[] has been processed, the block header is updated in block 526, as appropriate with the preferred file format.

Then, operation continues at conditional block 528, which checks whether the block was compressed. As is known, incompressible data actually expands upon attempted compression, owing to flag bit penalties associated with identifying literals, and the like. If the block was not effectively compressed, operation passes to block 530, which simply copies the input to the output, or in other words, copies the HB[] to the output buffer. In either case, operation continues at block 532 which once again updates the block header as appropriate. Operations end at node 534.

VI. FILLING THE SP[]

Figures 14, 15:
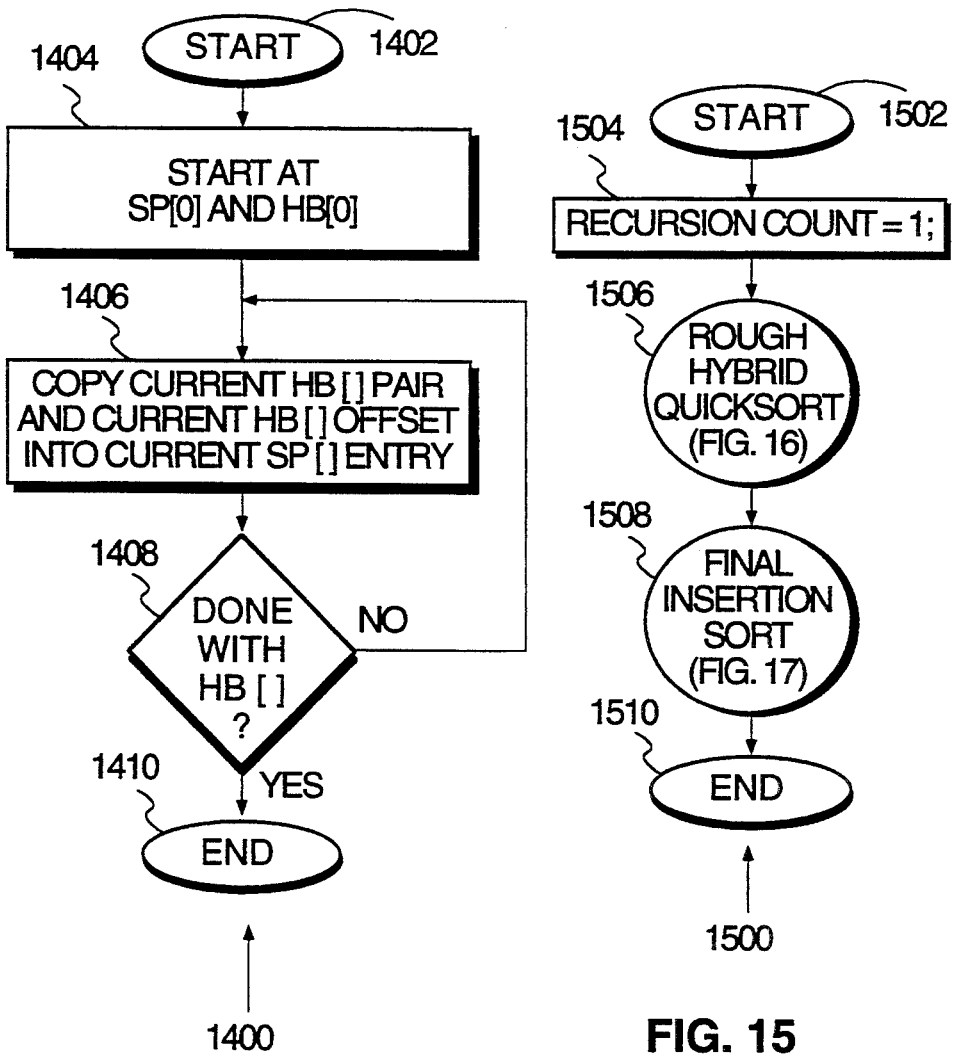
FIG. 14 is a flowchart illustrating operation of the present invention to fill the pairs array from the history buffer.
FIG. 15 is a flowchart illustrating high-level operation of the present operation to sort the contents of the pairs array to form the sorted pairs array.

FIG. 14 shows one mode of filling the SP[] from the HB[], starting at node 1402 and continuing at block 1404. At block 1404, the filling starts at HB[0] and SP[0].

Then, at block 1406, an SP[] entry is set. The offset item of the SP[] entry is simply set to offset of the current HB[] location. The data pair item is a copy of the current data pair.

At decision block 1408, the method determines whether all HB[] pairs have been loaded into the SP[]. If not, operation returns to block 1406 to load a next pair and offset. Otherwise, operation is complete at node 1410.

VII. SORTING THE SP[]

FIG. 15 illustrates, at a high level, the general method of sorting the SP[] after the SP[] entries are made. Operation passes from node 1502 to block 1504. The preferred method of sorting the SP[] is with a recursive quicksort, for purposes of speed. However, it has been observed that a quicksort may, on occasion, use up an excessive amount of a host processor's available stack space, owing to excess recursion—if the input data are too large, for example. Therefore, at block 1504, the method initializes a recursion level counter to one, signifying the first level of recursion.

Figure 16:
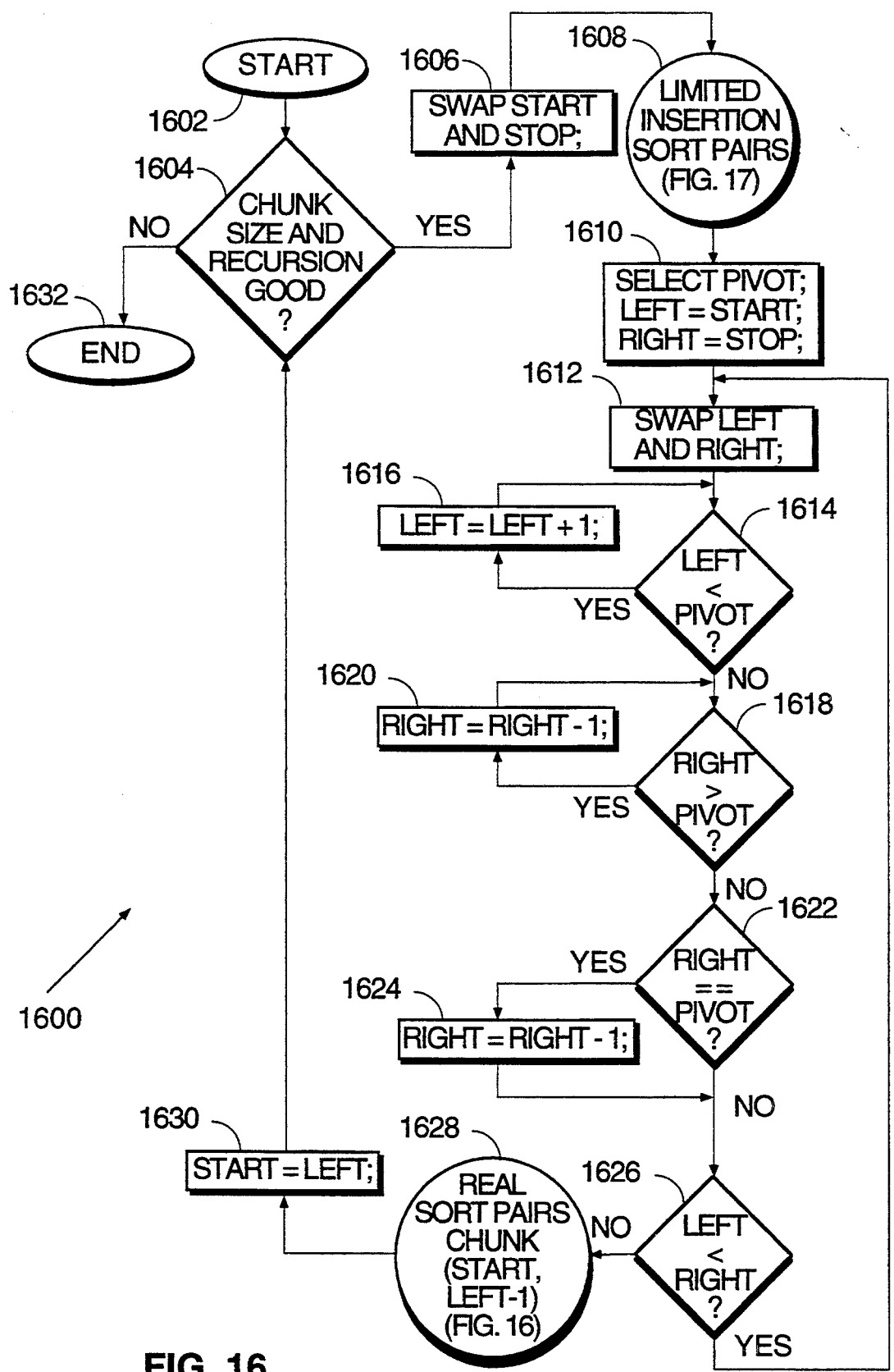
FIG. 16 is a flowchart depicting operation of the present invention to sort the pairs array by a hybrid sort methodology, including a preliminary incomplete insertion sort and a recursive quicksort.

Then, operation passes to node 1506, where the hybrid quicksort method of FIG. 16 performs a rough sort on the SP[]. Then, at node 1508, the insertion method of FIG. 17 performs a final, more refined insertion sort on the SP[]. Sorting ends at node 1510.

FIG. 16 shows the hybrid quicksort utilized to rough sort the SP[]. As is known in the art, quicksort operates recursively upon increasingly smaller "chunks" of the entire sort data. Operation begins at node 1602 and passes to conditional block 1604. At conditional block 1604, the quicksort checks whether two parameter conditions are met. First, the quicksort checks whether the chunk size is within an acceptable range. This check relates to the hybrid nature of the quicksort. It has been observed that for sorting a "chunk" of a relatively small number of data, quicksorting is slower than certain other methods of sorting. At block 1604, if the chunk size is below a predetermined number, the present instantiation (recursion) of the FIG. 16 method terminates at ending node 1632. In one mode, the minimum chunk size upon which quicksorting is performed is ten SP[] entries.

The second check which is performed at conditional block 1604 is a check of the current level of recursion. This prevents system crashes caused by stack overflow, in the event of "runaway" recursion such as may result from an execution error. If recursion has descended below a predetermined number of instantiations, execution of the current instantiation terminates at ending node 1632. In one mode, the maximum recursion count is twenty.

If both tests at conditional block 1604 are met, operation continues at block 1606, which swaps the values at the beginning and end of the current chunk.

Figure 17:
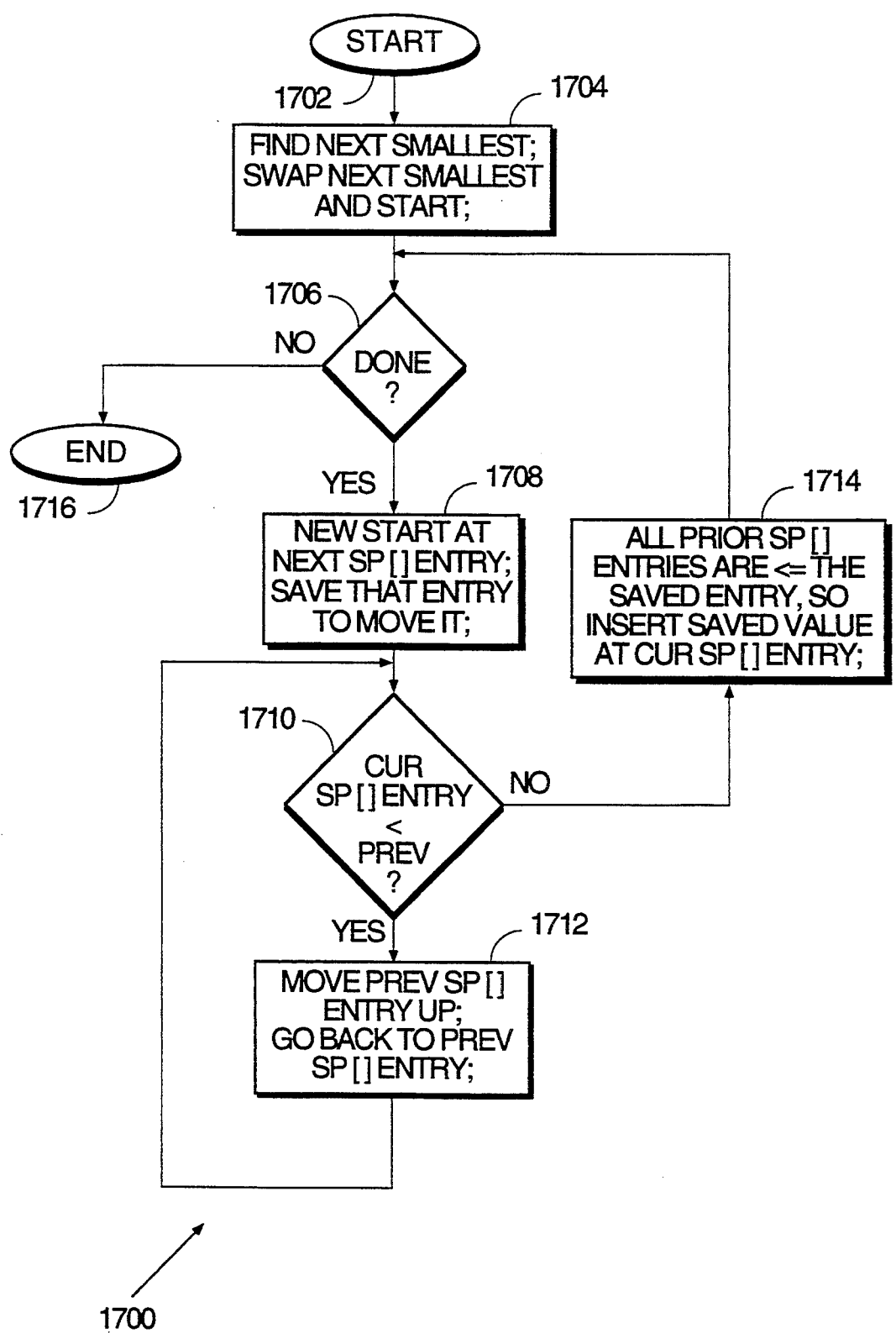
FIG. 17 is a flowchart depicting operation of the present invention to perform an insertion sort upon the pairs array.

Then, operation passes to node 1608 which represents the insertion sort method of FIG. 17. However, node 1608 does not perform a full insertion sort over the given chunk. Rather, it performs a limited insertion sort, which has been observed to speed up the overall sorting operation. This improves the quicksort's chances of selecting a "good" pivot.

After the limited insertion sort is performed upon the chunk, operation continues at block 1610, which selects the pivot. In blocks 1610 and 1612, the quicksort swaps the first and last elements in the chunk.

Then, operation passes to conditional block 1614, which checks whether the pivot element is greater than the left element of the chunk. If so, operation passes to block 1616, which advances the left pointer one element to the right, i.e. toward the pivot. This only advances the pivot, and does not move data. Data are moved at block 1612 only. Then, operation returns to conditional block 1614 for further testing.

Eventually, the left pointer will identify an element which is not less than the pivot, and operation will pass to conditional block 1618. Conditional block 1618 and block.1620 operate similarly to conditional block 1614 and block 1616, moving the right pointer leftward toward the pivot. When the right pointer identifies a data element which is not greater than the pivot element, operation passes to conditional block 1622.

Conditional block 1622 checks whether the right element is equal to the pivot element. If so, the right pointer is advanced one position past the pivot to the left, at block 1624. Regardless, operation then passes to conditional block 1626.

Conditional block 1626 checks whether the left and right pointers have passed each other. If not, operation passes back to block 1612, which swaps the new left and right elements, and checking begins again. If, at conditional block 1626, the left and right pointers have passed each other, the quicksort recursively calls itself at node 1628. Upon recursive entry, the new chunk size and recursion count will, of course, be checked as before.

When operation eventually returns from the new recursive instantiation of the quicksort, operation passes to block 1630, which moves the starting point to the right, to the point where the left pointer currently points. From there, operation passes back (non-recursively) to conditional block 1604, where operations continue as before. Thus, when viewed at a high level of abstraction, rough sorting of the HB[] very generally proceeds from HB[O] toward HB[M−1].

It will be understood that, depending upon the data and upon the predetermined recursion count limit, each given instantiation of the quicksort method may perhaps not fully sort the data in its particular chunk. Thus, after node 1506 in FIG. 15, the quicksort will be fully complete, but the SP[] may not be entirely sorted. That is why the insertion sort is invoked at node 1508. This is a full insertion sort over the entire SP[]. With the data in a nearly sorted configuration, the insertion sort will finish the sorting very rapidly, and the SP[] will be fully sorted, in a "pair-major, offset-minor" manner.

FIG. 17 illustrates the methodology of the insertion sort. Operation begins at node 1702, and passes to block 1704. At block 1704, the insertion sort finds the smallest element in the SP[]. With the SP[] nearly sorted by the quicksort, the smallest SP[] item will be found very near the beginning of the SP[]. Thus, the insertion sort will not have to spend much time looking for the smallest element. Once it is found, the smallest element is swapped with the first SP[] entry, at SP[0].

Then, operation passes to conditional block 1706, which checks whether the insertion sort is complete. If so, the insertion sort terminates at node 1716. Otherwise, operation continues at block 1708. At block 1708, the insertion sort advances to a next starting point. This takes advantage of the fact that the smallest element has already been placed at the beginning of the SP[]. After that is done, there is no need to look at that location for the second, third, etc. smallest items. Thus, the insertion sort will only start looking for a next smallest item after all previously-found smallest items. This, together with the nearly sorted contents of the SP[], ensure that the insertion sort will never have to search far for a next smallest element.

Also at block 1708, the insertion sort starts at this new starting point (which is where the next smallest item will be placed). Then, operation passes to conditional block 1710, where the insertion sort checks whether the SP[] entry at the new starting point is smaller than that at the next subsequent location. If so, operation passes to block 1712, which moves the SP[] entry at the new starting point one position toward the end of the SP[]. Then, operation returns to the conditional block 1710. If, at the conditional block 1710, the subsequent SP[] entry is not less than that at the new starting point, operation passes to block 1714, where the insertion sort moves the newly-found smaller item into SP[new start]. Then, operation returns to conditional block 1706, and the insertion sort continues.

It will be understood that any useful sorting method may be employed. The hybrid quicksort/insertion sort depicted has been found to produce the most satisfactory sorting speeds, owing to the particular sizes of the data structures employed.

VIII. INITIALIZATION AND LOADING OF THE DLT[]

FIG. 18 shows the method whereby the DLT[] is initialized and loaded, once the SP[] is fully sorted. Operation begins at node 1802, and passes to block 1804. At block 1804, all DLT[] entries are initialized to the reserved value, such as $FFFF_{hex}$. Then, operation continues at block 1806, where the method begins at SP[0].

Then, operation passes to conditional block 1808, which checks whether the entire SP[] has been processed. If so, operation terminates at node 1818. Otherwise, operation passes to block 1810, which causes the method the check a next pair of SP[] entries the next time around the loop.

Then, operation continues at conditional block 1812, which checks whether the data pair in the next SP[] entry is the same as that in the current SP[] entry. In other words, conditional block 1812 checks whether two consecutive SP[] entries have the same data pair value. If not, this identifies a non-repeated string in the HB[], and operation returns to conditional block 1808 to check a next set of pairs.

Otherwise, operation passes to conditional block 1814, which checks whether the DLT[] entry indexed by the repeated data pair value is still zeroed to the reserved value. In other words, conditional block 1814 checks whether the next SP[] entry is exactly the second SP[] entry to contain the given data pair value. If not, the DLT[] entry has already been set to point to the first SP[] entry containing the given data pair value. In other words, the DLT[] entry already accesses the first instance of the repeated string. In this case, operation passes back to conditional block 1808 to check a next pair of SP[] entries on the next loop.

Otherwise, operation passes to block 1816, which sets the DLT[] entry indexed by the current data pair to point to the first SP[] entry having the given data pair value. Thus, points the DLT[] entry accesses the first instance of the repeated string. In block 1816, the method advances to check a next pair of DLT entries, and operation returns to conditional block 1808.

IX. FINDING THE OPTIMALLY MATCHING STRING

Figure 19:
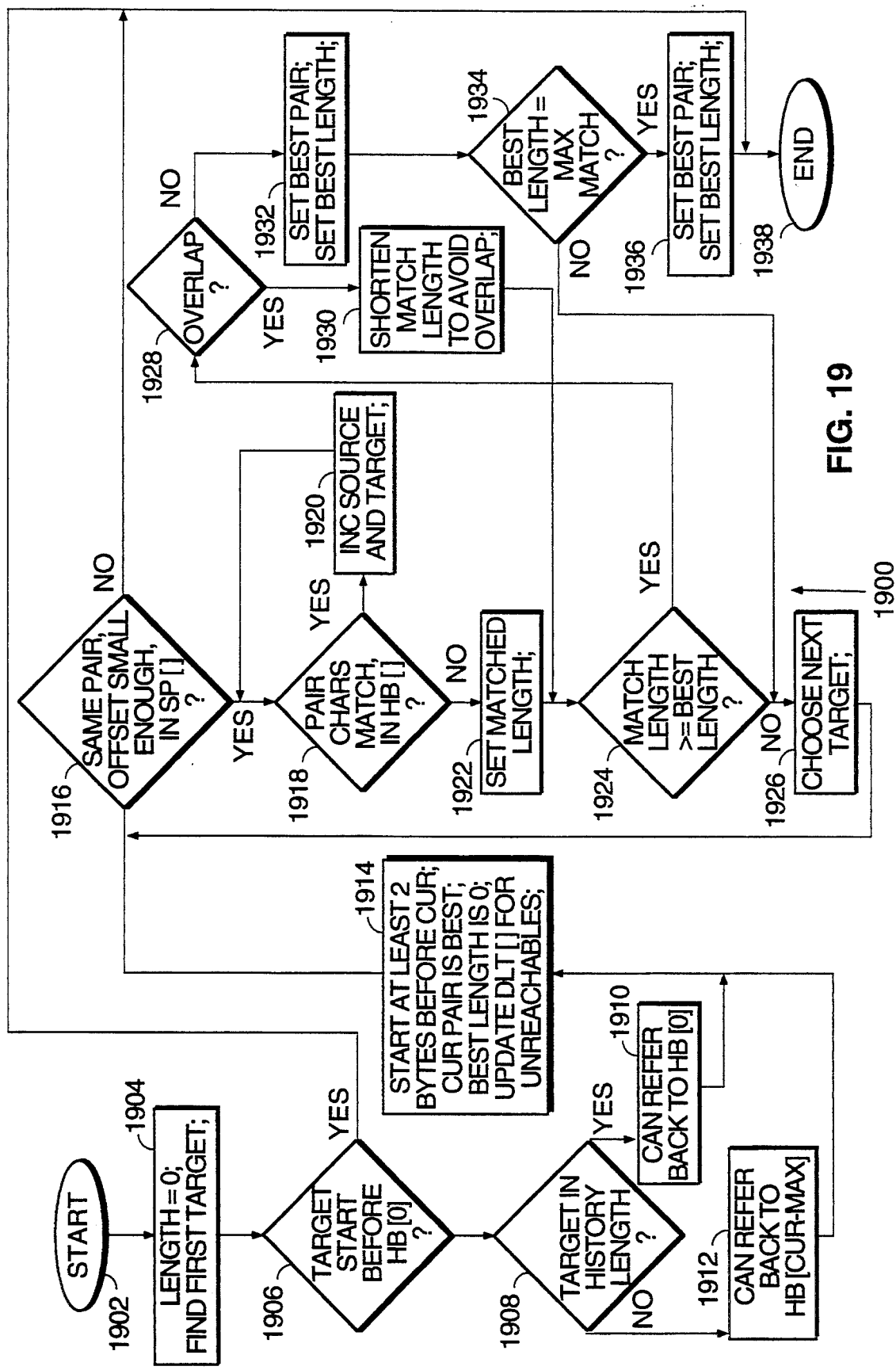
FIG. 19 is a flowchart depicting the operation of the present invention to find a best matching target string, using the direct lookup table and the sorted pairs array.

FIG. 19 illustrates the methodology by which the present invention locates, in a buffer, a prior target string which matches a current string to a greatest length. Operation passes from a starting node 1902 to block 1904, where the method sets a matched length counter to zero, and finds the first pair in the HB[] which pair matches the current pair in the HB[]. This first pair is found as HB[SP[DLT[HB[current location]]]]. In other words, the current pair is used as an index into the DLT[], and that DLT[] entry points to the first SP[] entry for a matching string in the HB[].

Next, operation continues at conditional block 1906, which checks whether the potential target string begins before the start of the HB[]. This would indicate an error condition. If so, operation terminates at ending node 1938. Otherwise, operation passes to conditional block 1908. At conditional block 1908, the method checks whether the current string is within a predetermined maximum history length back from the current string.

The predetermined history length need not be related to the size of the HB[]. Rather, the predetermined history length defines a maximum remembered "history" which the method will maintain. For example, the method may use an eight kilobyte HB[], but retain only a most recent four kilobytes of history. This allows, in effect, a "sliding" history, such as is well-known in the art. Early in the HB[], a vector may refer back as far as the beginning of the HB[] to reference the current string to a prior target string; later on in the HB[], a vector may only be allowed to reach a certain distance back from the current pair. The particular magnitude chosen for the predetermined history length will depend upon a variety of considerations, such as the chosen encoding method for vectors (so that the invention does not find target strings which are unreferenceable by a data compressor utilizing the invention, for example).

If the distance (offset) from the current pair back to the beginning of the HB[] is within the allowed history length, at block 1910, the method indicates that any target string starting no earlier than HB[0] is referenceable. Otherwise, at block 1912, the method indicates the earliest HB[] location which is referenceable.

Then, operation passes to block 1914. There, the method prevents referencing of any target string which is subsequent to the current pair in the HB[].

Also at block 1914, the method sets a best matching pair to point to the current pair, sets a best matching value to zero, and makes a copy of the current pair (for non-dereferenced use).

Then, operation continues at conditional block 1916, where the method checks the potential matching target string, to see whether it begins with the same pair as the current string. It also ensures that the offset from the current pair back to the potential target string is small enough for the chosen vector referencing method. If not, operation ends at node 1938.

Otherwise, operation passes to conditional block 1918, which checks whether a next (i.e. third or subsequent) byte in the potential target string matches a byte at the corresponding position in the current string. If so, operation passes to block 1920, which increments pointers which access the current and target strings. Then, operation passes back to conditional block 1918, to check a next byte in the target string against a next byte in the current string.

If, at block 1918, corresponding bytes in the target and current strings do not match (i.e. processing has advanced beyond the end of matching strings), operation passes to block 1922. At block 1922, the method saves the value of the matched length. Then, operation continues at conditional block 1924, where the method determines whether the just-matched length is greater than or equal to any previously-matched length.

If not, operation passes to block 1926, where the method selects the next potential target string, and operation passes back to conditional block 1916 to begin the checking of this new target against the current string.

Otherwise, operation passes to conditional block 1928, where the method checks whether the strings overlap. This feature is optional within the bounds of this invention, to allow the use of the same output format as is disclosed in the cross-referenced application. Overlap occurs when the target string extends into the current string. For example, the string "ABCDABCDABX" contains a target string "ABCDAB" which begins, at the first position, and which matches to length six the string "ABCDAB" which begins at the fifth position. However, there is an overlap in that the second instance of "AB" is included in both the target and the current string. It has been determined that some compression encoding methodologies operate more efficiently if overlapping is disallowed, such as is shown in FIG. 19.

If overlap is detected, operation passes to block 1930, which shortens the determined length of the target string such that no overlap exists (i.e. the target string will end at the byte immediately before the current pair), and operation returns to conditional block 1924 to check whether the shortened match length is still the longest so far.

If there is no overlap, operation passes from conditional block 1928 to block 1932, where the method indicates that the just-matched target is the best so far, saving indications of where the target begins, and the length to which it matches the current string.

Then, operation passes to conditional block 1934, where the method checks whether the matching target string length is equal to a predetermined maximum matching string length. This value is selected according to the chosen vector encoding method, to prevent identification of a target string longer than can be encoded. According to the cross-referenced application, the chosen maximum length is twenty bytes. However, in other modes, it could be nearly as large as the history buffer itself. It will be understood that conditional block 1934 could test for "greater than or equal to". However, the particular coding of the blocks 1918 and 1920 allows the use of a simple "equal to" test. In the preferred mode, the code representing blocks 1918 and 1920 has been "loop unrolled" to remove conditional branching instructions which have a known effect of reducing pipeline efficiency. The loop has been unrolled a number of times such that it is guaranteed that the longest string which can be matched is of exactly the maximum allowable string length.

At conditional block 1934, if the matching target string length is not greater than the maximum size, operation returns to block 1926, which selects a next target to match. Otherwise, operation passes to block 1936, where the method saves an indication of the starting position and matching length of the target string. These are the "results" of the method of FIG. 19; finding them is the goal of the core portion of the present invention.

Finally, operation terminates at node 1938.

X. PREFERRED ENVIRONMENT

The preferred environment, in which the present invention is practiced, is an Apple Macintosh computer having a microprocessor selected from the Motorola 680x0 microprocessor family. The invention may, however, be practiced using a wide variety of other systems. The source code, disclosed in the Appendix hereto, is written in a combination of C and assembly language, and has been written specifically for use with the Symantec Think C 5.0 compiler/assembler. The source code discloses the best mode contemplated for carrying out the invention, and further includes certain optimizations which have been made according to the preferred host processor and compiler/assembler. Those skilled in the art will readily appreciate that these optimizations need not necessarily be used when practicing this invention.

It will be understood that the heart of this invention lies in the methodology of using one or more bytes at a current position in the input data to directly or indirectly access a sorted array of pointers, to locate one or more previously-found instances of a potentially matching target string. While it is contemplated that one desirable method of doing this is to use two bytes at the current location to index a DLT[], and to then use the particular DLT[] entry to index an SP[], other similar methods are within the scope of this invention. For example, it may be desirable, depending upon a particular host computer for example, to use a first and a third byte at the current location, rather than a first and a second. It may further be desirable, depending upon the particular host computer, to use more or less than two bytes as an index. For example, on a host computer having a relatively large memory, it may be more desirable to use three or four bytes as an index.

Other adaptations will be understood by those skilled in the art. For example, the method may be fine-tuned according to the chosen "back-end", be it a data compressor or whatever. Specifically, the method may be adapted to find not just longest matching string, but a latest one of two or more such equally longest matching strings. This may enable the vector encoding method to utilize a more efficient vector, such as one having a reduced number of offset bits.

It will be further understood that, while the discussed embodiment uses indexing, corresponding embodiments may readily be constructed which use pointer addressing or the like.

It will further be understood that the present invention, which is a string location method, may be advantageously employed in areas other than data compression.

While the invention has been described with reference to the embodiment of a data compression system, its use in any suitable embodiment is contemplated. Various changes in the form and details discussed herein are possible within the scope of this disclosure, including but not limited to those discussed above. However, the invention is to be afforded protection according to the scope of the following claims.

I claim:

1. A machine-implemented method for searching for a prior string matching at least a beginning portion of a given current string, wherein the searched-for prior string is to be found in a machine-readable history buffer containing a plurality of prior strings, each prior string beginning with a predefined number of bits defining a string-start value, each string-start value being positioned at a corresponding string-start location in the history buffer, the current string also beginning with a series of bits defining a current string-start value, the method comprising the steps of:
    (a) providing a start-pointing array (SP{}) having a plurality of SP array entries, one for each prior string in the history buffer, each SP array entry identifying the string-start value of a corresponding prior string in the history buffer and further identifying the location in the history buffer at which the respective prior string begins;
    (b) determining if there are one or more SP array entries in the SP array corresponding to a prior occurrence of the current string-start value, and if so, accessing each of the corresponding one or more SP array entries to identify therefrom the location in the history buffer at which a respective prior string, if any, begins and has a string-start value equal to the current string-start value, each so-identified prior string constituting a target string;
    (c) determining, for each of an identified one or more target strings, an extent length to which the target string matches the current string;
    (d) identifying at least one of the target strings which matches the current string to a greatest length; and
    (e) outputting, in the case where at least one target string exists in the history buffer, an identification of the location of the at least one target string identified by said step (d).

2. The method of claim 1 wherein the step of (a) providing a start-pointing array ( SP{}) comprises the steps of:
    (a.1) scanning the history buffer to identify each string-start value contained in the history buffer,
    (a.2) for each identified string-start value, recording into a corresponding SP array entry, an indication of the location within the history buffer of the identified string-start value, and
    (a.3) sorting the SP array entries primarily by string-start value and secondarily by history buffer location.

3. The method of claim 2, wherein the history buffer stores a plurality of M bytes, wherein each string-start value includes a plurality of N consecutive bytes of the M bytes, and wherein:
    the steps of (a.1) scanning and of (a.2) recording identify no more than M-(N−1) string-start values and the SP array accordingly contains no more than M-(N−1) array entries.

4. The method of claim 3, wherein:
    N=2 and the current string-start value is correspondingly defined by a current pair of bytes, and the step of (b) determining uses the current pair of bytes to determine if and where a corresponding entry is stored in the SP array.

5. The method of claim 1, wherein:
    the steps of (c) determining, and (d) identifying, terminate upon finding a target string having a matching length equal to a predetermined maximum length.

6. The method of claim 1, further comprising the step of:
    (f) using the output search results to compress the data of the history buffer.

7. The method of claim 6, wherein:
    in addition to the step (e) of outputting an identification of an existing at least one target string, the search portion of the method alternatively outputs an indication that no matching target string exists in the case where no target string exists in the history buffer to match the current string; and
    the compress portion (f) of the method includes the steps of:
    (f.1) responsive to a search output indicating that no matching target string exists, encoding the value of the current string as a literal copy of itself in the compressed output of the history buffer, and
    (f.2) responsive to a search output that indicates a target string exists and that identifies the location of the target string, encoding the value of the current string as a compression vector that points to the location in the history buffer of the matching target string.

8. A machine-implemented method for searching for a prior string matching at least a beginning portion of a given current string, wherein the searched-for prior string is to be found in a machine-readable history buffer containing a plurality of prior strings, each prior string beginning with a predefined number of bits defining a string-start value, each string-start value being positioned at a corresponding string-start location in the history buffer, the current string also beginning with a series of bits defining a current string-start value, the method comprising the steps of:

(a) providing a start-pointing array (SP{}) having a plurality of SP array entries, one for each prior string in the history buffer, each SP array entry identifying the string-start value of a corresponding prior string in the history buffer and further identifying the location in the history buffer at which the respective prior string begins;

(b) determining if there are one or more SP array entries in the SP array corresponding to a prior occurrence of the current string-start value, and if so, accessing each of the corresponding one or more SP array entries to identify therefrom the location in the history buffer at which a respective prior string, if any, begins and has a string-start value equal to the current string-start value, each so-identified prior string constituting a target string;

(c) determining, for each of an identified one or more target strings, an extent length to which the target string matches the current string;

(d) identifying at least one of the target strings which matches the current string to a greatest length; and (e) outputting, in the case where at least one target string exists in the history buffer, an identification of the location of the at least one target string identified by said step (d);

wherein the step of (a) providing a start-pointing array (SP{}) comprises the steps of:

(a.1) scanning the history buffer to identify each string-start value contained in the history buffer, (a.2) for each identified string-start value, recording into a corresponding SP array entry, an indication of the location within the history buffer of the identified string-start value and (a.3) Sorting the SP array entries primarily by string-start value and secondarily by history buffer location; said method further comprising the step of:

(f) defining a machine-readable direct-lookup table (DLT{}) having a plurality of direct-lookup table entries, each direct-lookup table entry having a unique string-start value associated therewith and identifying the location of a corresponding first SP array entry, if any, in the start-pointing array (SP{}) that has a corresponding string-start value associated therewith, and wherein the step of (b) determining comprises the steps of:

(b.1) using the current string-start value as an index into the direct-lookup table to identify a given table entry; and (b.2) using the identified table entry to determine if there are one or more SP array entries in the SP array corresponding to a prior occurrence of the current string-start value, and if so, further using the identified table entry as an index into the array to access a corresponding one or more SP array entries.

9. The method claim 8, wherein said step (f) of defining the machine-readable direct-lookup table (DLT{}) comprises the steps of:

(f.1) scanning the sorted SP array to identify therefrom each unique string-start value that actually appears in the history buffer, (f.2) recording an invalid index code in the corresponding direct-lookup table entry of each unique string-start value that is found, as a result of said scanning step (f.1), to not have a counterpart appearing in the history buffer, and (f.3) recording a valid index code in the corresponding direct-lookup table entry of each unique string-start value that is found, as a result of said scanning step (f.1), to have a predetermined nonzero number of counterparts appearing in the history buffer, said valid index code pointing to an SP entry within said SP array that indicates the location within the history buffer of at least one counterpart string-start value.

10. The method of claim 9, wherein:

the step (f.2) of recording an invalid index code includes setting the corresponding direct-lookup table entry to index a location outside the SP array; and the step (f.3) of recording a valid index code includes setting the respective direct-lookup table entry to index a respective SP array entry which identifies a string-start value equal to the respective string-start value of the respective direct-lookup table entry.

11. The method of claim 10, wherein:

the step (f.3) of recording a valid index code sets the respective direct-lookup table entry to point to a respective SP array entry which further identifies an earliest location of the history buffer containing the respective string-start value.

12. The method of claim 11, further comprising the step of:

updating a given direct-lookup table entry to access an SP array entry subsequent to the SP array entry that identifies the earliest location of the history buffer containing the respective string-start value, to prevent access to target strings which are farther back from the current string than a predetermined maximum offset.

13. The method of claim 9, further comprising the step of;

(f.2a) recording an invalid index code in the corresponding direct-lookup table entry of each unique string-start value that is found, as a result of said scanning step (f.1), to not have at least two counterparts appearing in the history buffer.

14. The method of claim 13, wherein the step (f.2a) of recording an invalid index code includes:

comparing string-start values identified by two or more consecutive entries in the SP array to determine whether a string-start value is repeated in the history buffer.

15. The method of claim 9, wherein the history buffer includes M bytes, wherein each string-start value includes N consecutive bytes of the M bytes, and wherein:

the step (f) of defining the direct-lookup table constructs the table to include $256^N$ table entries, each corresponding uniquely to a respective N-byte string-start value.

16. The method of claim 15, wherein:

N=2.

17. A machine-implemented method for searching for a prior string matching at least a beginning portion of a given current string, wherein the searched-for prior string is to be found in a machine-readable history buffer containing a plurality of prior strings, each prior string beginning with a predefined number of bits defining a string-start value, each string-start value being positioned at a corresponding string-start location in the history buffer, the current string also beginning with a series of bits defining a current string-start value, the method comprising the steps of:
- (a) creating a machine-readable start-pointing array (SP{}) having a plurality of SP array entries, one for each prior string in the history buffer, each SP array entry identifying the string-start value of a corresponding prior string in the history buffer and further identifying the location in the history buffer at which the respective prior string begins;
- (b) creating a machine-readable direct-lookup table (DLT{}) having a plurality of direct-lookup table entries, each direct-lookup table entry having a unique string-start value associated therewith and identifying the location Of a corresponding one or more SP array entries, if any, in the start-pointing array (SP{}) that have a corresponding string-start value associated therewith;
- (c) responsive to the current string-start value, accessing a corresponding direct-lookup table entry;
- (d) responsive to an SP entry location identified by the corresponding direct-lookup table entry, accessing the corresponding one or more SP array entries, if any, that are associated with the current string-start value;
- (e) responsive to respective history buffer locations, if any, that are identified by the corresponding one or more SP array entries, designating the respective prior strings as target strings and comparing the length of match between each target string and the current string to thereby identify at least one target string in the history buffer, if there is one, that matches the current string to a maximum extent; and
- (f) outputting, in the case where one or more target strings exist in the history buffer, an identification of the location of the at least one target string identified by said step (e).

18. The method of claim 17, wherein the step (a) of creating the start-pointing array (SP{}) includes:
- (a.1) sorting the SP array according to the string-start values of the corresponding prior strings.

19. The method of claim 18, wherein the step (a) of creating the start-pointing array (SP{}) further includes:
- (a.2) sorting the SP array according to the locations in the history buffer at which string-start values of the respective prior strings begin.

20. The method of claim 17, wherein said step (b) of creating the direct-lookup table (DLT{}) comprises the steps of:
- (b.1) scanning the SP array to identify therefrom each unique string-start value that actually appears in the history buffer;
- (b.2) recording an invalid index code in the corresponding direct-lookup table entry of each unique string-start value that is found, as a result of said scanning step (b.1), to not have a counterpart appearing in the history buffer; and
- (b.3) recording a valid index code in the corresponding direct-lookup table entry of each unique string-start value that is found, as a result of said scanning step (b.1), to have a predetermined nonzero number of counterparts appearing in the history buffer, said valid index code pointing to an SP entry within said SP array that indicates the location within the history buffer of at least one counterpart string-start value.

21. The method of claim 20, further comprising the step of:
- (b.3) recording an invalid index code in the corresponding direct-lookup table entry of each unique string-start value that is found, as a result of said scanning step (b.1), to not have a counterpart appearing at least twice in the history buffer.

22. The method of claim 21, further comprising the step of:
sorting the SP array primarily according to the string-start values and secondarily according to the history buffer locations of the string-start values.

23. The method of claim 22, wherein:
the current string-start value comprises a pair of bytes (CURPAIR) stored in a memory region immediately following the history buffer; and
the step (d) of accessing the corresponding one or more SP array entries includes access by a multi-level access operation having the form, SP{DLT{CURPAIR}}, where the argument in each array access of the form,_ array{index},_ is an index to an entry in the corresponding array.

24. The method of claim 23, further comprising the steps of:
updating the direct-lookup table entry at DLT{CURPAIR} to index to a next SP array entry at a location following the location of the SP array entry previously indexed to by the entry at DLT{CURPAIR}, for the purpose of preventing access to a target string which is farther back within the history buffer from the location of the current string than a predetermined maximum offset.

25. The method of claim 17, further comprising subsequent compression steps of:
using the identification output by said step (f) of the location of the at least one target string to generate a corresponding at least one compression vector pointing to the location in the history buffer of the at least one target string, and
outputting the at least one compression vector as part of a compressed data file representing uncompressed data originally held in the history buffer.

26. An automated search machine for searching for a prior string matching at least a beginning portion of a given current string, wherein the searched-for prior string is to be found in a machine-readable history buffer containing a plurality of prior strings, each prior string beginning with a predefined number of bits defining a string-start value, each string-start value being positioned at a corresponding string-start location in the history buffer, the current string also beginning with a series of bits defining a current string-start value, said machine comprising:
a memory for storing the history buffer (HB{});
DLT-creating means for creating in said memory a direct-lookup table (DLT{}) having a plurality of direct-lookup table entries, one for each string-start value that is likely to appear in the history buffer, each table entry being uniquely addressable by a corresponding string-start value;

SPA-creating means for creating in said memory an SP array (SP{}) having a plurality of SP array entries, one for each string-start value that actually appears in the history buffer, each SP array entry identifying the location in the history buffer of the corresponding string-start value;

DLT-initializing means for initializing respective direct-lookup table entries to each point to a corresponding SP array entry in the case where the SP array indicates that a nonzero predefined number of prior strings exist in the history buffer and have the corresponding string-start value;

target string locating means, operatively coupled to the direct-lookup table and to the SP array, for locating target strings stored within the history buffer in response to a supplied current string-start value, each located target string having a string-start value matching the current string-start value, the target string locating means first consulting the direct-lookup table, after initialization of the direct-lookup table, to locate an SP entry,_ if any,_ pointing to a corresponding target string and then consulting the located SP entry for locating the corresponding target string;

match length determining means, coupled to the target string locating means, for comparing each located target string against the given current string to determine a length to which each so-located target string matches the current string; and maximum match identifying means, coupled to the match length determining means, for identifying a target string,_ if any,_ that matches the current string to a maximum extent, and for outputting an identification of the location in the history buffer of the identified target string that matches the current string to said maximum extent.

27. A data compressor for compressing data stored in a history buffer (HB{}), wherein the history buffer data defines a plurality of prior strings, each prior string beginning with a predefined number of bits defining a string-start value, each string-start value being positioned at a corresponding string-start location in the history buffer, the data compressor comprising:

SPA-creating means for constructing an array (SP{}) of SP array entries each uniquely identifying a string-start value contained in the history buffer and further identifying the string-start location in the history buffer of the corresponding string-start value;

SPA-sorting means for sorting the SP array entries;

target string locating means, operatively coupled to the SP array, for locating target strings stored within the history buffer in response to a designated one of successive current string-start values found in the history buffer, each located target string having a string-start value matching the designated current string-start value, the target string locating means consulting the SP array, after the SP array is sorted, to locate an SP entry,_ if any,_ pointing to a corresponding target string and then using the located SP entry for locating the corresponding target string;

match length determining means for comparing each located target string against a designated current string to determine and indicate which of the located target strings,_ if any,_ matches the designated current string to a maximum extent;

literal means, responsive to an indication that no target string matches the designated current string, for outputting as literal data the current string-start value; and vector means, responsive to an indication that a given target string matches the current string to a maximum extent, for outputting as vector data an offset signal identifying the location in the history buffer of the given target string.

28. The data compressor of claim 27, wherein the SPA-sorting means sorts the SP entries primarily on string-start value and secondarily on the location in the history buffer of the corresponding string-start value.

29. The data compressor of claim 27, wherein the means for sorting further comprises:

means for performing a quicksort.

30. The data compressor of claim 29, wherein:

the means for performing a quicksort performs a hybrid quicksort/insertion sort.

31. The data compressor of claim 27, wherein the means for comparing comprises:

means for halting comparison upon encountering a target string which matches the current string to a predetermined maximum length encodable by the vector means.

32. The data compressor of claim 27, wherein:

the data compressor further comprises means for reading a data file into an input buffer in blocks of predetermined size; and the SPA-creating means for constructing an array, the SPA-sorting means, the target string locating means, the match-length determining means, the literal means, and the vector means are responsive to the means for reading so as to reset their respective operations at the beginning of each newly input block, and to thereby output independently-compressed data blocks.

* * * * *